(12) United States Patent
Kato et al.

(10) Patent No.: US 6,292,412 B1
(45) Date of Patent: Sep. 18, 2001

(54) CLOCK CONTROL CIRCUIT

(75) Inventors: Koji Kato; Masahiro Kamoshida; Shigeo Ohshima, all of Yokohama; Hiroyuki Ohtake, Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/609,145

(22) Filed: Jun. 30, 2000

(30) Foreign Application Priority Data

Jun. 30, 1999 (JP) .................................................. 11-187052

(51) Int. Cl.⁷ ...................................................... G11C 7/00
(52) U.S. Cl. ........................................... 365/194; 365/233
(58) Field of Search ....................................... 365/194, 233

(56) References Cited

U.S. PATENT DOCUMENTS 5,867,432  2/1999  Toda ...................................... 365/194

6,205,086 * 3/2001 Hanzawa et al. ..................... 365/233

* cited by examiner

Primary Examiner—David Nelms
Assistant Examiner—M. Tran
(74) Attorney, Agent, or Firm—Finnegan, Henderson, Farabow, Garrett, & Dunner, L.L.P.

(57) ABSTRACT

A clock synchronous circuit comprising a clock receiver, a delay monitor, a forward pulse delay circuit, a backward pulse delay circuit, a driver, a state-holding section, a control signal generating circuit, a first AND circuit, and a second AND circuit. The delay monitor delays the output of the clock receiver. The forward pulse delay circuit delays the output of the delay monitor. The backward pulse delay circuit delays the output of the clock receiver. The driver receives the output of the backward pulse delay circuit and outputs an internal clock signal. The state-holding section controls the backward pulse delay circuit. The control pulse generating circuit initializes the forward pulse delay circuit. The first AND circuit is provided for controlling the supply of the output of the clock receiver to the delay monitor. The second AND is provided for controlling the supply of the output of the delay monitor to the forward pulse delay circuit.

21 Claims, 20 Drawing Sheets

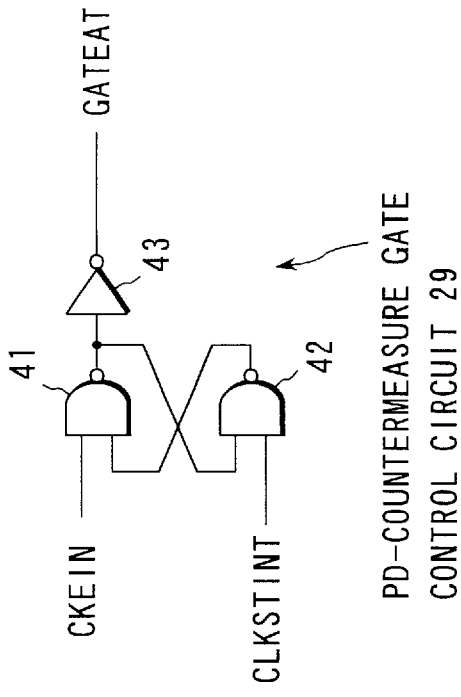
F I G. 7
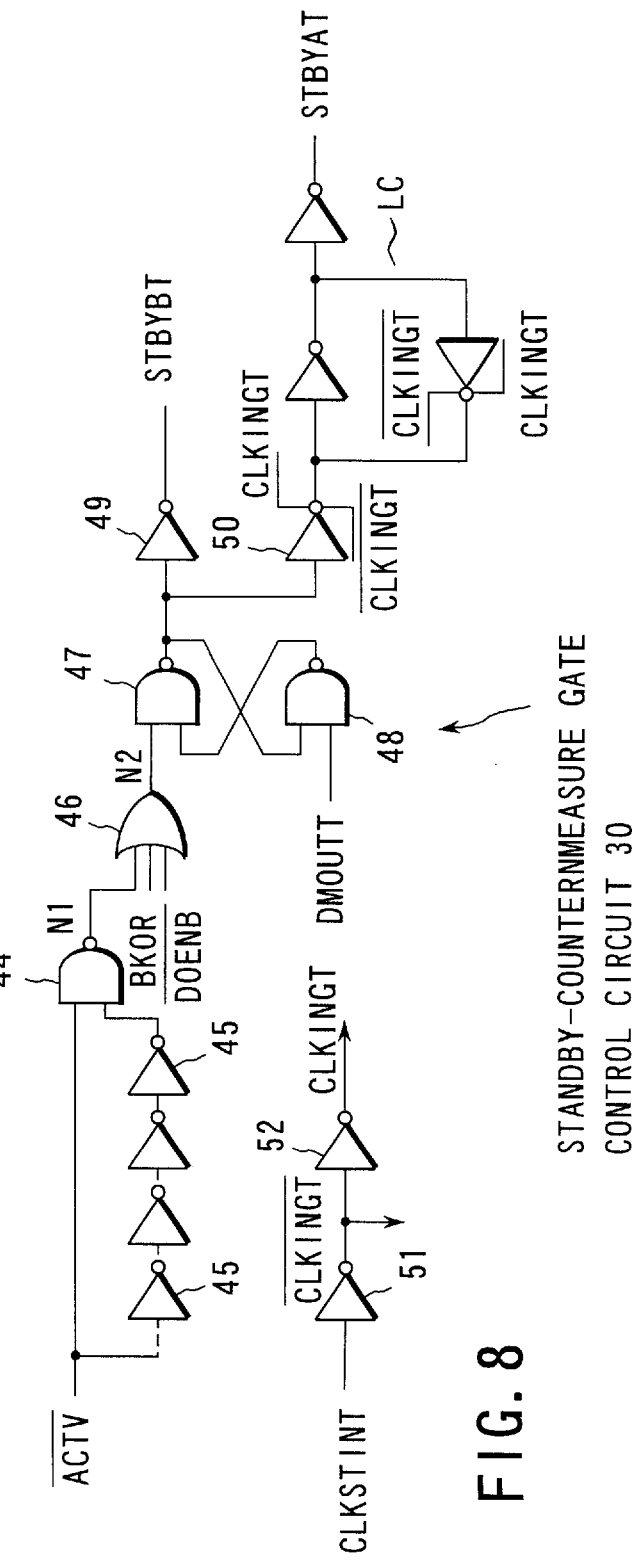
F I G. 8

FCLT GATE CONTRROL CIRCUIT 31

CONTROL PULSE GENERATING CIRCUIT 19

CLOCK CONTROL CIRCUIT

CROSS-REFERENCE TO RELATED APPLICATIONS

This application is based upon and claims the benefit of priority from the prior Japanese Patent Application No. 11-187052, filed Jun. 30, 1999, the entire contents of which are incorporated herein by reference.

BACKGROUND OF THE INVENTION

The present invention relates to the clock synchronous circuit which is used in semiconductor devices, such as double data rate synchronous DRAM, especially to the clock synchronous circuit suitable for such devices as those which perform synchronous control by using a high-speed clock.

In recent years, clock synchronous type memories, such as synchronous DRAM, are used in computer systems, reflecting demands for high-speed processing. Such a clock synchronous type memory utilizes the clock, which synchronizes with the clock supplied from the outside of the memory (to be referred to as the external clock hereinafter) to control internal operation, by generating it inside the memory.

In case a synchronous lag takes place between the clock used inside the memory (to be referred to as the internal clock hereinafter) and the external clock, it will be liable to cause mis-operation in the internal circuit of the memory especially in high-speed processing even if the lag is very small. Furthermore, the use of the internal clock, which has a synchronous lag arising between it and the external clock, hinders high-speed operation on the side of the controller using data read from the memory.

Thus recent memories are beginning to be mounted with clock synchronous circuits which are designed to synchronize the internal clock to the external clock with high precision.

However, while memories mounted with clock synchronous circuits are capable of performing stable high-speed operation, their power consumption become larger correspondingly, compared with the memories which are not mounted with clock synchronous circuits.

In order to reduce such a disadvantage, it is desired to reduce power consumption by halting the operation of the clock synchronous circuit as far as possible when the internal circuit of the memory does not require the internal clock outputted from the clock synchronous circuit.

However, conventional clock synchronous circuits are not capable of reducing power consumption in actual practice even by halting the operation because they have no established methods for halting and controlling the operation nor established halt control circuits.

BRIEF SUMMARY OF THE INVENTION

Accordingly, the objects of the present invention are to reduce power consumption by halting the generating operation of the internal clock when it is not needed, as well as to provide the clock synchronous circuit which is capable of resuming the generation of the stable clock output when the operation is needed.

According to the first aspect of the present invention, a clock synchronous circuit is provided, comprising a clock receiver for receiving an external clock signal; a delay monitor for receiving and delaying an output of the clock receiver; a first delay circuit for receiving and delaying an output of the delay monitor; a second delay circuit for receiving an output of the clock receiver in a cycle next to the signal delayed by the first delay circuit, and for delaying the output by a delay time substantially equal to a delay time of the first delay circuit; a driver for receiving an output of the second delay circuit and outputting an internal clock signal; a first gate circuit provided between the clock receiver and the delay monitor, for controlling supplying of the output of the clock receiver to the delay monitor, in accordance with a first control signal; and a second gate circuit provided between the delay monitor and the first delay circuit, for controlling supplying of the output of the delay monitor to the first delay circuit, in accordance with a second control signal.

According to the second aspect of the present invention, a clock synchronous circuit is provided, comprising a clock receiver for receiving an external clock signal; a first gate circuit for receiving at least an output of the clock receiver and a first control signal and controlling supplying of the output of the clock receiver in accordance with the first control signal; a delay monitor for receiving and delaying an output of the first gate circuit; a second gate circuit for receiving an output of the delay monitor and a second control signal and controlling supplying of the output of the delay monitor in accordance with a second control signal; a forward pulse delay circuit including a plurality of first delay units connected in cascade, designed to receive the output of the second gate circuit, each of the first delay units delay the output by a specific time, respectively, and supply the output as a forward pulse to the following first delay unit; a backward pulse delay circuit including a plurality of second delay units connected in cascade, designed to receive the output of the clock receiver, each of the second delay units delay the pulse for a specific time, respectively, and supply the output as a backward pulse to the following second delay unit; a driver for receiving the backward pulse supplied from the backward pulse delay circuit and generating an internal clock signal from the backward pulse; a state-holding section including a plurality of state-holding circuits associated with the first delay units and second delay units, the state-holding section being one designed to control the second delay units such that each state-holding circuit comes to hold a set state when the associated first delay unit receives a forward pulse and a reset state when the associated second delay unit receives a backward pulse and that the output of the clock receiver is input as a backward pulse to any second delay unit that is associated with a state-holding circuit which comes to hold a reset state after the output of the delay monitor is input to the forward pulse delay circuit and. before the backward pulse is propagated through the back pulse delay circuit; a third gate circuit for receiving the output of the clock receiver, the first control signal and a third control signal and controlling the output of the clock receiver in accordance with the first control signal and the third control signal; a control pulse generating circuit for receiving the output of the clock receiver and the second control signal, controlling the output of the third gate circuit in accordance with the second control signal, and generating a first control pulse for resetting the first delay units; a state-holding circuit for receiving the first control pulse and generating the second control pulse for resetting some of the state-holding circuits provided in the state-holding section, in accordance with the first control pulse; and a control signal generating circuit for generating the first, second and third control signals.

According to the third aspect of the present invention, a clock synchronous circuit is provided, comprising a first clock receiver for receiving a first external clock signal; a first delay monitor for receiving and delaying an output of the first clock receiver; a first delay circuit for receiving and delaying an output of the first delay monitor; a second delay circuit for receiving the output of the first clock receiver in a cycle next to the signal delayed by the first delay circuit, and for delaying the output by a delay time substantially equal to a delay time of the first delay circuit; a first driver for receiving an output of the second delay circuit and generating a first internal clock signal; a first gate circuit provided between the first clock receiver and the first delay monitor, for controlling supplying of the output of the first clock receiver to the first delay monitor in accordance with a first control signal; a second gate circuit provided between the first delay monitor and the first delay circuit, for controlling supplying of the output of the first display monitor to the first delay circuit in accordance with a second control signal; a second clock receiver for receiving a second external clock signal that is out of phase with respect to the external clock; a second delay monitor for receiving and delaying the output of the second clock receiver; a third delay circuit for receiving and delaying the output of the second delay monitor; a fourth delay circuit for receiving the output of the second clock receiver in a cycle next to the signal delayed by the third delay circuit, and for delaying the output of the second clock receiver, by a time substantially equal to delay time of the third delay circuit; a second driver for receiving an output of the fourth delay circuit and outputting a second internal clock signal; a third gate circuit provided between the second clock receiver and the second delay monitor, for controlling supplying of the output of the second clock receiver to the second delay monitor in accordance with a third control signal; and a fourth gate circuit provided between the second delay monitor and the third delay circuit, for controlling supplying of the output from the second delay monitor to the third delay circuit in accordance with a fourth control signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is the circuit diagram showing the detailed configuration of the PD-countermeasure control circuit in FIG. 6B;

FIG. 8 is the circuit diagram showing the detailed configuration of the standby-countermeasure gate control circuit in FIG. 6B;

DETAILED DESCRIPTION OF THE INVENTION

Figure 1:
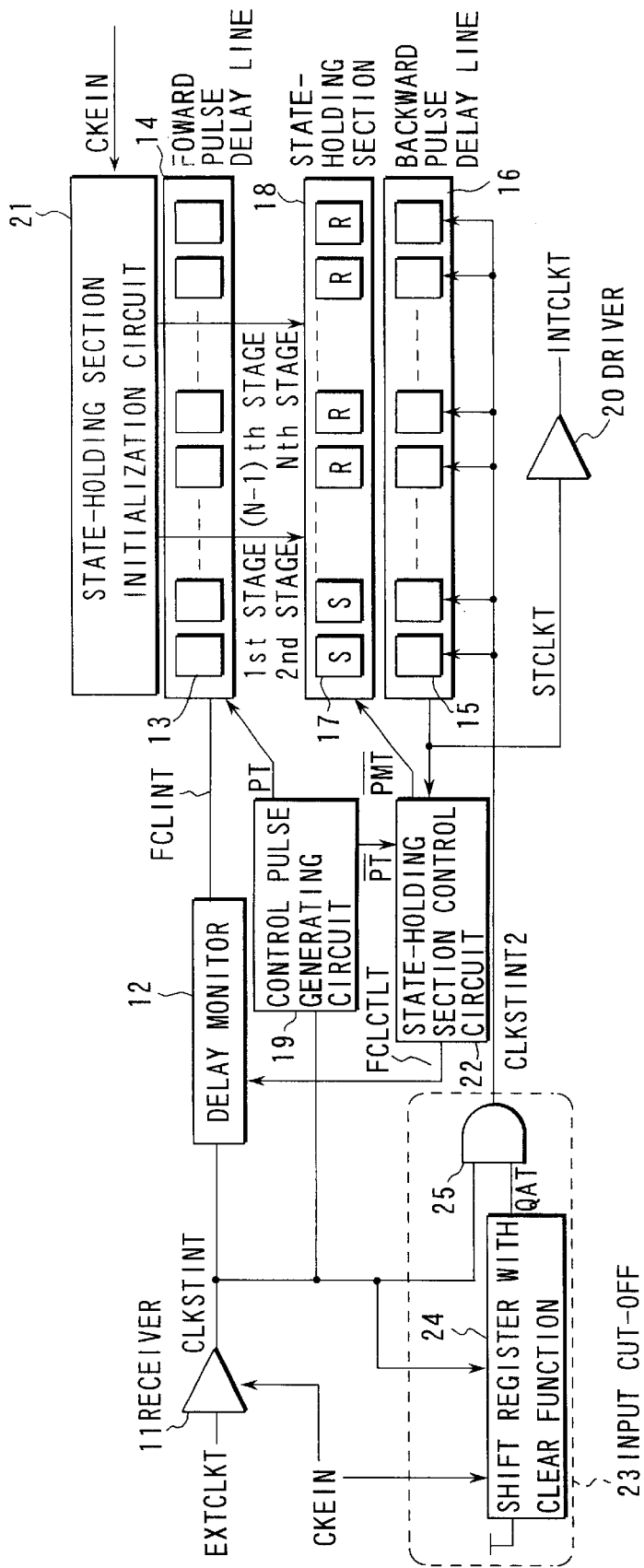
FIG. 1 is the block diagram showing the configuration of the clock synchronous circuit which has adopted STBS proposed by the present inventor.

FIG. 1 is the block diagram showing the configuration of the clock synchronous circuit which has adopted the STBD (Synchronous Traced Backward Delay) proposed in the patent application Jpn. Pat. Appln. No. 11-35946 which was invented by the present inventor prior to the present invention.

This clock synchronous circuit is comprised of a clock receiver 11, a delay monitor (delay circuit) 12, a forward pulse delay line 14 consisting of a multiple number of delay unit 13 connected in series by multi-stages, a backward pulse delay line 16 consisting of the same number of the delay unit 15 connected in series by multi-stages as the delay units 13 in the forward pulse delay line 14, a state-holding section 18 which have the same number of a state-holding circuit 17 as the delay units provided respectively in the forward pulse delay line 14 and the backward pulse delay line 16 and which outputs the control signal for controlling a pulse delay operation in the backward pulse delay line 16 according to a state of pulse delay in the forward pulse delay line 14, a control pulse generating circuit 19 which generates control pulse signals PT and /PT for controlling an operations of the forward pulse delay line 14 and the state-holding section 18, a driver 20 which outputs an internal clock, a state-holding section initialization circuit 21 for initializing the state-holding section 18, a state-holding section control circuit 22 for controlling an operation of the state-holding section 18 and the delay monitor 12, and an input signal cut-off circuit 23.

It should be noted that the output from the delay unit 13 at the Nth stage in the forward pulse delay line 14 is to be inputted to the state-holding circuit 17 at the Nth stage in the state-holding section 18 and that the output from the state-holding circuit 17 at the Nth stage in the state-holding section 18 is to be inputted to the delay unit 15 at the (N−1)th stage in the backward pulse delay line 16.

Hereinafter, the circuit consisting of the forward pulse delay line 14, backward pulse delay line 16 and state-holding section 18 will be referred to as STBD.

Figure 2:
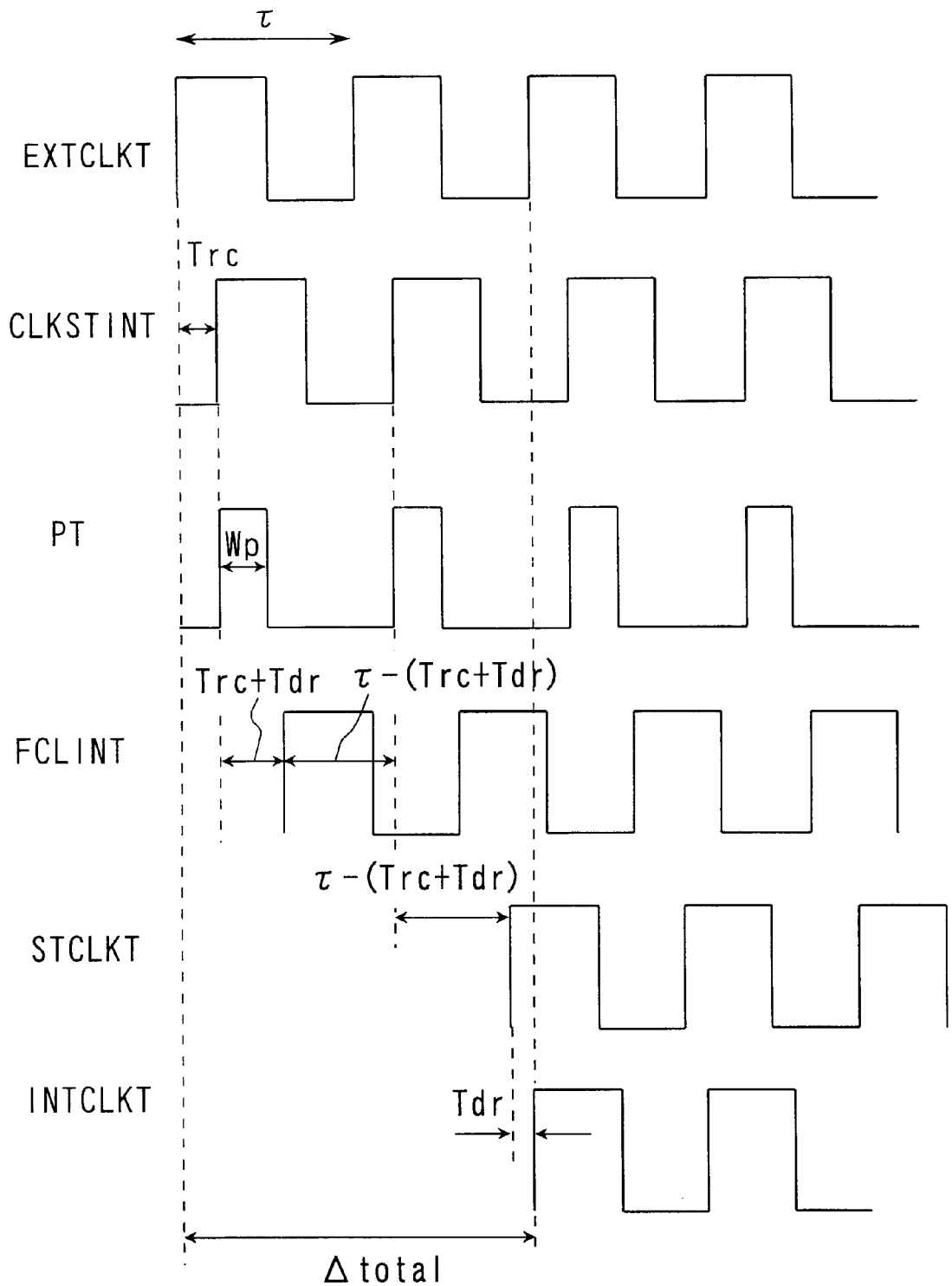
FIG. 2 is the timing chart showing the basic operation of the clock synchronous circuit illustrated in FIG. 1.

FIG. 2 is the timing chart illustrating a basic operation of the clock synchronous circuit shown in FIG. 1. The operation of the clock synchronous circuit in FIG. 1 will be explained below by using FIG. 2.

We now assume a case where an external clock EXTCLKT having the cycle τ is inputted to the clock receiver 11. The external clock EXTCLKT is shaped in waveform, amplified, and outputted from the clock receiver 11 as the pulse EXTCLKT.

If we assume that the delay time in the clock receiver 11 is Trc, a pulse CLKSTINT is delayed by Trc to the external clock EXTCLKT. The pulse CLKSTINT outputted from the receiver 11 is inputted to the delay monitor 12 and the control pulse generating circuit 19, and at the same time to the backward pulse delay line 16 as well through the input cut-off circuit 23.

The control pulse generating circuit 19, receiving the pulse CLKSTINT, synchronizes with the rise of this pulse CLKSTINT, and outputs the complementary control pulse signals PT and /PT (diagram of /PT is omitted) having the pulse width Wp. The pulse width Wp of these control pulse signals PT and /PT will be set so that it will be shorter than the duration of (Trc+Tdr) if the delay time in the driver 20 is Tdr. The reason is that if the pulse width Wp becomes longer than (Trc+Tdr), the output from the delay monitor 12 will not propagate properly through the forward pulse delay line 14.

In real terms, the delay monitor 12 will have the delay time (Trc+Tdr) as the sum of the delay time Trc in the receiver 11 and the delay time Tdr in the driver 20. Accordingly, a pulse FCLINT outputted from the delay monitor 12 is delayed, as shown in FIG. 2, by the duration (Trc+Tdr) from the pulse CLKSTINT outputted from the receiver 11, and inputted to the forward pulse delay line 14.

As described in the foregoing, the forward pulse delay line 14 consists of a multiple number of the delay units 13 which are connected in series by multi-stages. And the delay unit 13 at each stage propagates the forward pulse from the preceding stage to the subsequent stage when the control pulse signal PT is "L" level, and on the other hand, terminates propagation of the forward pulse when the control pulse signal PT is "H level."

During the duration {τ−(Trc+Tdr)} from the time when this forward pulse 14 begins to propagate the pulse FCLINT till the time when the control pulse signal PT reaches "H" level, the pulse FCLINT propagates through the forward pulse delay line 14.

The state-holding section 18 memorizes the propagation status of the forward pulse in the respective state-holding circuits 17, and controls the operation of the backward pulse delay line 16 on the basis of this information so that the propagation time of the backward pulse will be equal to that of the forward pulse. In other words, the state-holding circuits 17 in the state-holding section 18 are all kept in the reset status in the initial state, while the state-holding circuits 17 corresponding to the delay units 13 in the forward pulse delay line 14, to which the forward pulse is not propagated, remains in the initial reset status.

On the other hand, the state-holding circuits 17 corresponding to the delay units 13 in the forward pulse delay line 14, to which the forward pulse propagates, changes to the set state. And the control signals generated by corresponding to the set/reset status of the respective state-holding circuits 17 are inputted to the backward pulse delay line 16.

The delay units 15 in the backward pulse delay line 16 which are controlled by the control signals from the state-holding circuits 17 corresponding to the set status outputs the backward pulse propagated from the delay unit 15 in the backward stage to the delay unit 15 in the forward stage.

On the other hand, the delay units 15 in the backward pulse delay line 16, controlled by the control signals from the state-holding circuits 17 corresponding to the set status, outputs the pulse CLKSTINT outputted from the receiver 11 (output pulse CLKSTINT2 from the input cut-off circuit 23) to the delay unit 15 at the forward stage.

As the pulse CLKSTINT changes to "H" level when the control pulse signal PT changes to "H" level, this pulse CLKSTINT at "H" level is inputted parallel to the delay units 15 ((N+1)th and subsequent stages in FIG. 1) controlled by the control signals from the state-holding circuit 17 in the reset state.

If we assume here that the number of stages of the delay unit 13 in the forward pulse delay line 14, to which the forward pulse is propagated, is N stages, the respective state-holding circuits 17 from the first stage to the Nth stage in the state-holding section 18 are set in the set status (S) as shown in FIG. 1.

This causes the pulse CLKSTINT, which is inputted from the delay unit 15 at the Nth stage in the backward pulse delay line 16 controlled by the control signal from the state-holding circuit 17 at the N+1th stage in the state-holding circuit 18 set in the reset status (R), to be propagated as the backward pulse to the delay unit 15 in the forward stage.

As a result, the number of the delay unit 15, to which the backward pulse propagates, equals the number of stages of the delay unit 13 in the forward pulse delay line 14, to which the forward pulse has propagated.

At this point if it is so designed that the signal delay time in the respective delay units in the forward pulse delay line 14 and the backward pulse delay line 15 equals each other, the pulse CLKSTINT inputted to the backward pulse delay line 16 will propagate through the delay units 15 during the same duration of {τ−(Trc+Tdr)} as in the case of the pulse FCLINT propagated through the forward pulse delay line 14, and is outputted as the pulse STCLKT as shown in FIG. 2.

This pulse STCLKT is then delayed by the duration of Tdr by passing through the driver 20, and is outputted as the internal clock INTCLKT as shown in FIG. 2.

At this point if we assume that the delay time from the time when the internal clock EXTCLKT is inputted till the time when the internal clock INTCLKT is outputted is Δtotal, Δtotal is expressed as follows:

$$\Delta total = \Delta msr + \Delta prp \quad (1)$$

In the formula (1), Δmsr is the time required for the forward pulse to propagate through several stages of the delay unit 13 in the forward pulse delay line 14, and Δprp is the time required for the internal clock INTCLKT to be outputted on the basis of the number of stages propagated by the forward pulse.

As described in the foregoing, time Trc when the external clock EXTCLKT passes the receiver 11, time (Trc+Tdr) when the pulse CLKSTINT passes the delay monitor 12, time {τ−(Trc+Tdr)} when the pulse FCLINT passes the forward pulse delay line 16, and time Tdr when the pulse STCLKT passes the driver 20 are required respectively, leading to the following formulas which represent Δmsr and Δprp in the formula (1) respectively.

$$\Delta msr = (Trc+Tdr) + \{\tau - (Trc+Tdr)\} = \tau \quad (2)$$

$$\Delta prp = Trc + \{\tau - (Trc+Tdr)\} + Tdr = \tau \quad (3)$$

In other words, as Δtotal becomes 2τ, the internal clock INTCLKT synchronizes in two cycles of the external clock EXTCLKT, and will synchronize with the external clock EXTCLKT from the third clock cycle.

In addition, the state-holding circuit 22, corresponding to the backward pulse STCLKT and the control pulse signal /PT, outputs the control signal /PMT for controlling the operation of the state-holding section 18 as well as the control signal FCLCTLT for adjusting (extending) the delay time in the delay monitor 12.

Furthermore, the input signal cut-off circuit 23 consists of the 1-bit shift register 24 which receives the pulse CLKSTINT outputted from the clock receiver 11 as a synchronous signal and which outputs a signal QAT by shifting the "H" signal in synchronization with the pulse CLKSTINT as well as the 2-input type AND circuit 25 which receives the output signal QAT from this shift register 24 and the pulse CLKSTINT outputted from the receiver 11 and which outputs a signal CLKSINT2 in response to the two inputs.

In other words, the above-mentioned shift register 24 outputs an "H" signal as the signal QAT after the pulse CLKSTINT rises to "H" first and the pulse CLKSTINT falls to "L". And the AND circuit 25 also outputs the pulse CLKSTINT outputted from the receiver 11 as CLKSINST2 when the output signal QAT of the shift register 24 is "H". On the other hand, when the output signal QAT from the shift register 24 is "L", CLKSTINS2 always becomes "L" regardless of the output from the receiver 11.

Incidentally, there exists in the memory the power down mode which enables the reduction of power consumption by halting the operation of the internal circuits of the memory. Furthermore, two modes exists in this power down mode. In the memory, the independently controllable group of memory cell array and its control circuit are called Bank. The power down mode in the state where either bank is selected is called Active Power Down Mode, and the power down mode in the (non-active) state where neither bank is selected is called Standby Power Down Mode. There is a signal CKE as an external input control signal used to control such a power down mode. When this control signal CKE reaches "L" level, the power down mode is entered (power down entry), and when CKE reaches "H" level, the power down mode exits (power down exit).

When trying to control the clock receiver 11 by the control signal CKE to terminate and restart the operation, the clock receiver 11 is controlled by the signal CKEIN which is received by a receiver that does not illustrate the external input control signal CKE, as shown in FIG. 1.

Next, we will explain about the problems which will arise when the power down entry takes place and exits after the lapse of a certain time in real terms.

When the power down mode is entered, the operation of the clock receiver 11 stops and the output CLKSTINT is always fixed at "L" level or "H" level regardless of the external clock EXTCLKT. This operation terminates the supply of the clock to the circuit subsequent to the clock receiver 11.

We now assume a case where the output is fixed, for example, at "L" level when the receiver 11 has stopped.

When the output of the clock from the receiver 11 stops, the generation of the control pulse signal PT, which stops the forward pulse, is terminated. Then the clock inputted before it, output from the receiver 11 stops thus continues to propagate on and on from the delay monitor 12 until it reaches the last stage of the forward pulse delay line 14. This operation causes more state-holding sections 17 than required for synchronization to be turned to the set state.

Next, when the receiver 11 is restarted with the power down exit and resume the output of the clock, if more state-holding circuits 17 than necessary for establishing synchronization are preset in the set state, the propagation of the backward pulse will require longer time than that of the forward pulse, thus causing a problem which disables synchronization.

Therefore, in the clock synchronous circuit in FIG. 1, the state-holding section initialization circuit 21 is provided to detect changes in the level of the control signal CKEIN and force the initialization (reset stale) of all the state-holding circuits 17 in the state-holding section 18.

However, even with this state-holding circuit 21, if the duration of the power down time is short, the following problem will arise. In other words, if the time from the power down entry to the power down exit is short, there is a possibility that the clock inputted before the operation stops is still passing inside the delay monitor 12 or is propagating inside the forward pulse delay line 14. In such a case, as the initialization of the state-holding section 18 is released with the power down exit, the clock before it stops begins at the same time to set the state-holding section 18 to the set state again, and hinders the synchronizing operation that follows the power down exit. Moreover, while the state-holding section 18 is set to the set state by the clock inputted before the operation is stopped, through current flows in the state-holding section 18 during the time when the state-holding section 18 is being set to the reset state by the state-holding section initialization circuit 21.

Next, we assume a case where the output from the receiver 11 is fixed at "H" level when the receiver 11 has stopped. During the duration of the power down, a signal at "H" level is constantly being supplied to the forward pulse delay line 14, forcing the state-holding section 18 to be set to the set state. For this reason, even if the state-holding section initialization circuit 18 tries to initialize the state-holding section 18 to prepare for the state following the powder down exit, the initialization does not take place as expected. Furthermore, the through current will continue to flow during that time. Also, as the "H" level signal still remains in the delay monitor 12 after the power down exit, this "H" level signal begins to set the state-holding sections 18 to the set state again, hindering the synchronous operation after the power down exit.

Incidentally, it is well known that jitter is included in the external clock. Jitter means the cyclic fluctuation of the clock. The clock synchronous circuit needs to be operating properly even when such jitter is happening.

For instance, let us suppose that affected by jitter, the cycle of the external clock becomes shorter by δ compared with the immediately preceding cycle τ. Even in such a case, it is necessary for the backward pulse STCLKT to be generated by having the output from the receiver 11 inputted to the delay units 15 in the backward pulse delay line 16 whose number equals the number of stages corresponding to the delay units 13 in the forward pulse delay line 14 in which propagation of the forward pulse has stopped, in order to establish synchronization.

Figure 3:
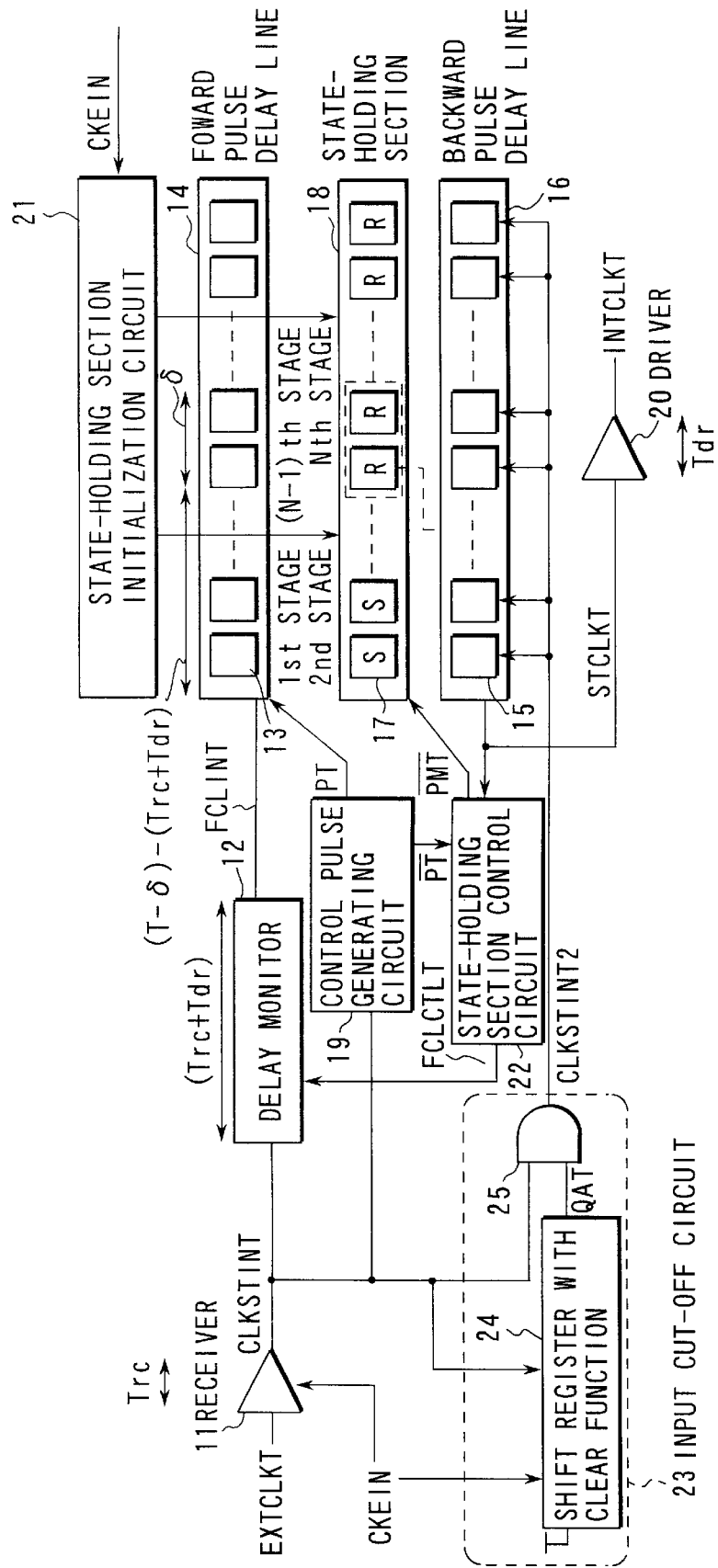
FIG. 3 is the block diagram explaining the example of one operation in the clock synchronous circuit of FIG. 1.

However, the forward pulse propagates in the immediately preceding cycle only during the duration of {τ−(Trc+Tdr)}, causing the state-holding circuits 17 in the section surrounded by a broken line in FIG. 3 to be set to the set state. In other words, more state-holding circuits 17 than necessary for establishing synchronization are set to the set state in the preceding cycle. And as a countermeasure against jitter, it is necessary at every cycle to keep the state-holding circuits 17 in the section surrounded by the broken line in the reset state before propagation of the forward pulse for the next cycle begins.

Also unless the state-holding section control circuit 22 is provided, it becomes difficult to cope with the external clock with a duty of more than 50%.

Thus in the clock synchronous circuit shown in FIG. 1, it is so designed. to enable coping with the function of the countermeasure against jitter and the external clock having a duty of more than 50%.

Although we make only a brief explanation here, the state-holding section control circuit 22 controls the timing for setting to the reset state the state-holding circuits 17 in the section surrounded by a broken line in FIG. 3. It also has a function to control the pulse width of the forward pulse to make it extend in the delay monitor 12, with a purpose to prevent the backward pulse from being propagated in the backward pulse delay line 16 immediately after the state-holding circuit 17 is reset. This control of the extension function of the delay time is done by the control signal FCLCTLT which is generated in the state-holding section control circuit 22.

However, this addition of the extension function of the forward pulse width leads to a case where mis-operation occurs after the power down exit.

Figure 4:
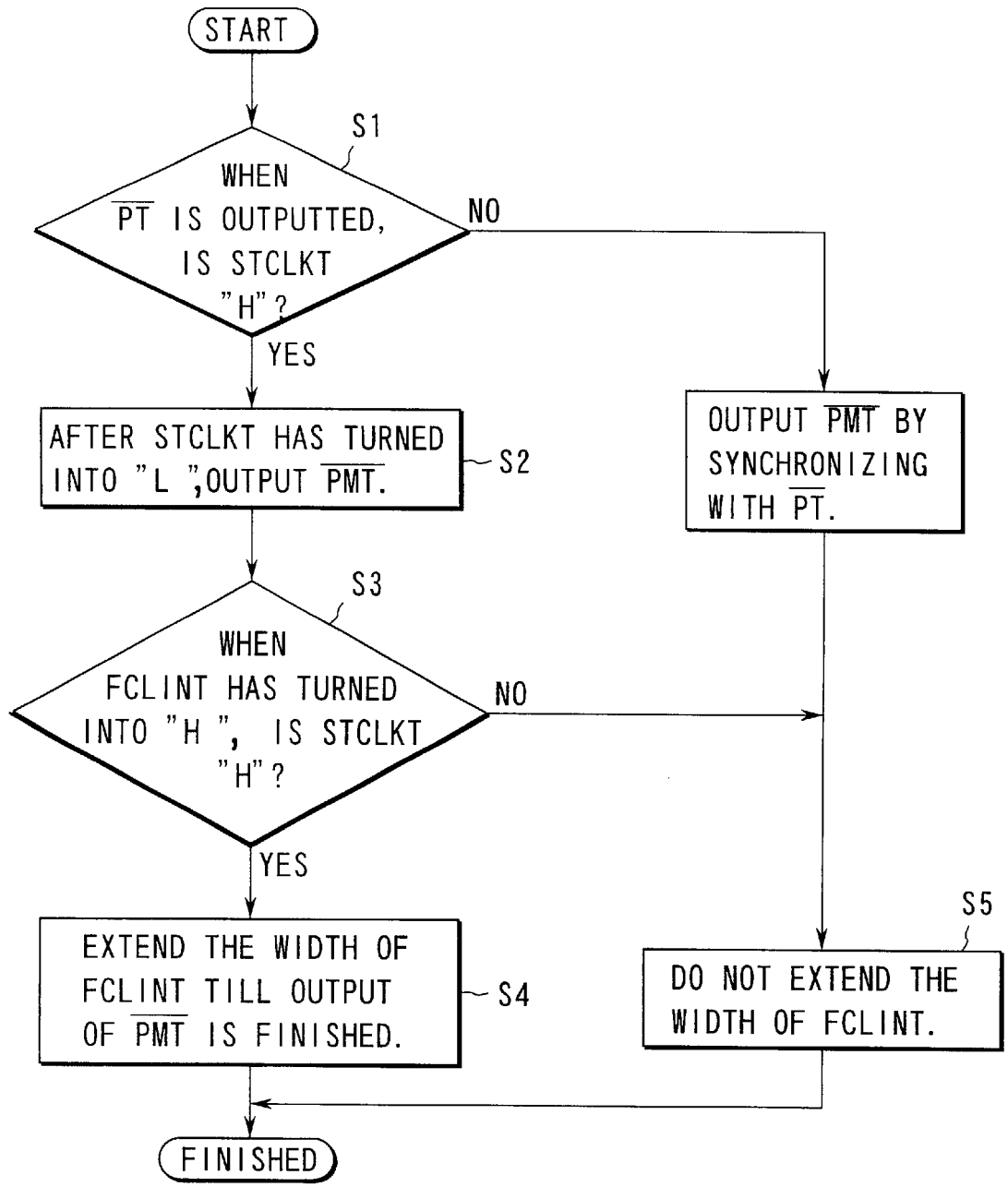
FIG. 4 is the flowchart illustrating the example of control operation by the state-holding section control circuit in the clock synchronous circuit of FIG. 1.

We will explain the control operation by the above-mentioned state-holding section control circuit 22 by using the flowchart in FIG. 4.

First, when the control pulse /PT is outputted in step S1, whether the backward pulse STCLKT is "H" or not is judged. When the duty of the backward is high and the backward pulse STCLKT is "H", the reset signal /PMT is generated after the backward pulse STCLKT becomes "L" at step S2, delaying the reset operation of the state-holding section 18.

In case a move is made from step S1 to step S2, when the forward pulse FCLINT becomes "H" at step S3, whether the backward pulse STCLKT is "H" or not is judged. In case the backward pulse STCLKT is "H", control is made to extend the pulse width of the forward pulse FCLINT. And at step S4, the pulse width of the forward pulse FCLINT is extended until the reset operation of the state-holding section 18 is terminated by the reset signal /PMT.

In other words, the above-mentioned steps S1 through S4 set the level of the reset signal /PMT to control the operation of the state-holding section 18.

At this point, during the duration of the reset signal /PMT remaining at "H" level, the output signal is set to "H" level, inducing the set state, in the state-holding circuits 17 corresponding to the delay unit in the forward pulse delay line 14 to which the forward pulse has been propagated.

On the other hand, during the duration of the reset signal /PMT remaining at "L" level, the output signal is set to "L" level, inducing the reset state, in the state-holding circuits 17 corresponding to the delay unit in the backward pulse delay line 16 to which the backward pulse has been propagated.

Accordingly, in case the reset signal /PMT generated in the state-holding section control circuit 22 is synchronized with the control pulse signal /PT, it is outputted to the forward pulse delay line 14, delayed for as long as the designated delay time without extending the pulse width of the forward pulse FCLINT in the delay monitor 12, as shown in step S5.

Figure 5:
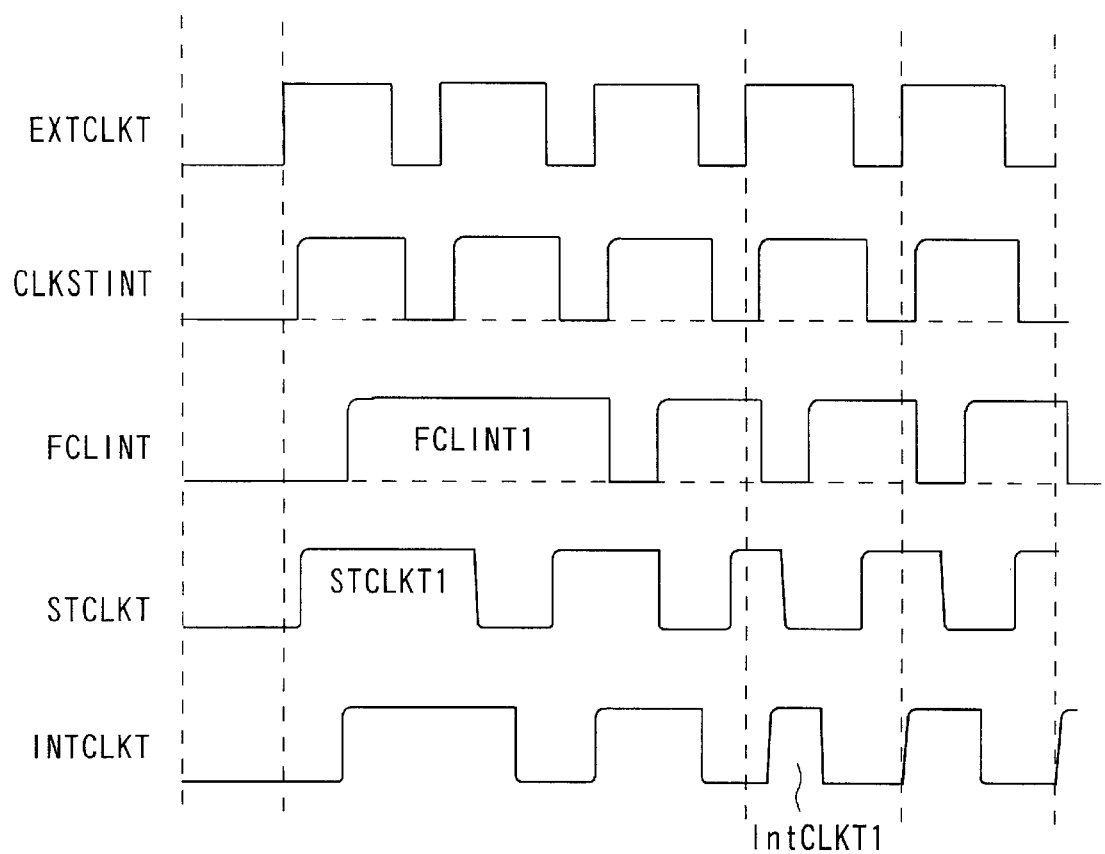
FIG. 5 is the timing chart illustrating the example of one operation in the clock synchronous circuit of FIG. 1.

Next, we will explain the process of mis-operation of the function designed to extend the forward pulse width after the power down exit by using the waveform diagram in FIG. 5.

The state-holding circuits 17 in the state-holding section 18 are all initialized by the state-holding section initialization circuit 21 before the supply of the output CLKSTINT from the receiver 11 is started. Accordingly, as the state-holding circuits 17 in the state-holding section 18 are all reset when the supply of the clock is started, all delay units 15 in the backward pulse delay line 16 fetch output signals form the receiver 11 in parallel and output them to the delay units in the preceding stage respectively. As the result of this operation, after the power down exit, the first output CLKSTINT (CLKSTINT2) from the receiver 11, which has been inputted to the delay unit 15 at the forefront stage in the backward pulse delay line 16, is outputted as the pulse STCLKT as it is (the pulse STCLKT1 in FIG. 5).

In the backward pulse delay line 16, the signal of the cycle τ must be outputted after propagating for as long as {τ−(Trc+Tdr)}. However, the first backward pulse does not propagate only one stage through the delay unit 15. For this reason, the first pulse STCLKT becomes faster than the normal output timing, overlapping the output of the control pulse signal /PT synchronizing with the pulse STCLKT. In this case, the result of judgment in step Si in the flowchart of the above-mentioned FIG. 4 becomes "YES". After this, while the reset timing of the state-holding section 18 is being delayed, the pulse FCLINT rises. Accordingly, in step S3, the pulse width of the forward pulse is extended. Moreover, it becomes a longer pulse by overlapping with the pulse propagated from the backward stage (STCLKT1 in FIG. 5). As a result, the internal clock intCLKT1, which is defined on the basis of the information propagated by the second forward pulse, does not synchronize with the external clock of the fourth external clock cycle.

Therefore, in the clock synchronous circuit shown in FIG. 1, it is so designed to prevent the first pulse outputted from the receiver 11 from being inputted to the backward pulse delay line 16 after the power down exit by providing further the input cut-off circuit 23 so that the mis-operation of the forward pulse extension function will be avoided.

Now, after fixing the input of the shift register 24 to "H" level and setting the initial value of the output QAT of the shift register 24 after the power down exit to the "L" level by using the control signal CKEIN, if the shift register 24 is controlled by shifting with the output CLKSTINT of the receiver 11, the signal QAT is set to the "H" level after the output of the receiver 11 in the first cycle has been supplied, after which the output CLKSTINT from the receiver 11 is supplied to the backward pulse delay line 16 by way of the AND circuit 25. Accordingly, the output CLKSTINT of the receiver 11 subsequent to the second cycle is inputted to the backward pulse delay line 16 as CLKSTINT2, thus preventing the mis-operation of the forward pulse extension function.

However, even by adding the input cut-off circuit 23, problems like the following will arise if the first pulse outputted from the receiver 11 after the power down exit does not meet the designated cycle.

In other words, depending on the timing of the power down exit, there is a possibility that the first output of the receiver 11 becomes very unstable, resulting in the output of the clock which does not meet the designated cycle.

The clock, which does not meet the designated cycle, affects not only the precision of the internal clock which is established by that clock, but also induces the mis-operation of the forward pulse extension function, affecting the internal clock after the two cycles of the internal clock established by the clock which does not satisfy the designated cycle.

In other words, in the input cut-off circuit 23, after the clock CLKSTINT, which does not meet the designated cycle, has been inputted at the first cycle after the power down exit, the signal QAT turns to "H" level, outputting the clock CLKSTINT of receiver 11 as CLKSTINST2 from the next cycle.

On the other hand, if the cycle is shorter than the designated cycle τ, the clock, which does not meet the designated cycle, terminates propagation in the middle of the delay monitor 12. In this case, as the clock does not propagate also to the delay unit 13 at the first stage of the forward pulse delay line 14, the state-holding section 18 remains in the initialized state, and the state-holding circuits 17 are in the rest state at all stages. In other words, the clock CLKSTINT outputted from the receiver 11 at the next cycle is inputted to the first stage (the forefront stage) of the backward pulse delay line 16, activating the forward pulse extension function in the delay monitor 12.

As described above, in the clock synchronous circuit of FIG. 1, it cannot be said that sufficient countermeasures against the power down mode have been taken, and various problems existed in terminating the operation in actual practice.

Also in the modes other than the power down mode, the clock receiver 11 continues operating, supplying at all times the clock to the delay monitor 12 and the forward pulse delay line 14, etc. Accordingly, it was not possible to stop operation in the modes other than the power down mode.

Figures 6A, 6B:
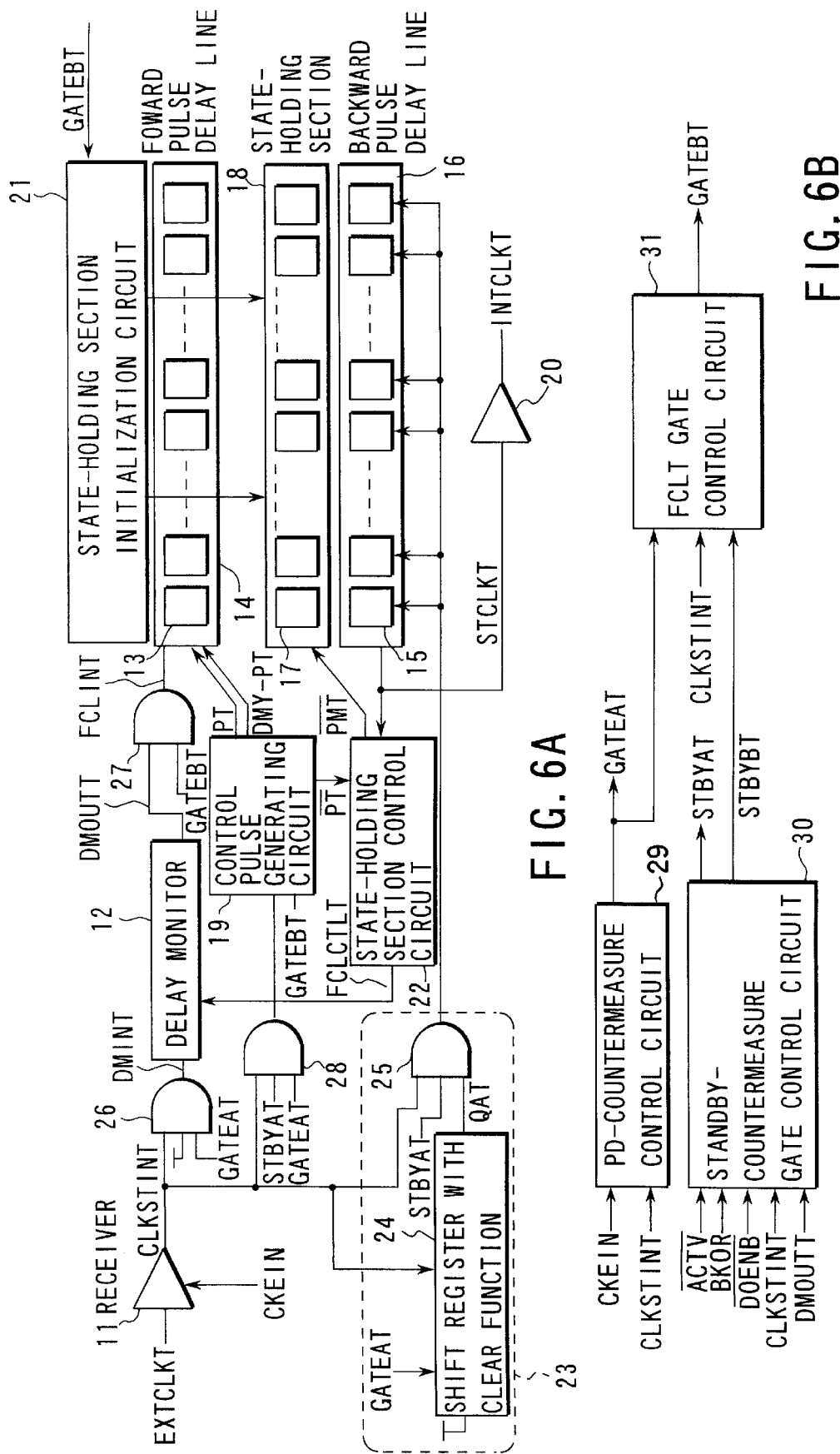
FIGS. 6A and 6B are the block diagrams showing the configuration of the clock synchronous circuits as a whole in the form of the first embodiment of the present invention.

FIGS. 6A and 6B are the block diagrams showing the whole configuration of the clock synchronous circuit in the form of the first embodiment of the present invention. Also in FIG. 6A, we will explain by putting the same numeral to the part which corresponds to the clock synchronous circuit shown in FIG. 1.

The clock synchronous circuits of FIGS. 6A and 6B are provided with the clock receiver 11, the delay monitor 12, the forward pulse delay line 14 comprised of a multiple number of delay units 13 connected in series by multi-stages, the backward pulse delay line 16 comprised of the same number of the delay units 15 connected in series by multi-stages as the delay units 13 in the forward pulse delay line 14, the state-holding circuit 18 which has the same number of state-holding circuits 17 as the respective delay units 13 and 15 provided in the forward pulse delay line 14 and the backward pulse delay line 16 and which outputs the control signal to control the pulse delay operation in the backward pulse delay line 16 according to the pulse delay state in the forward pulse delay line 14, the control pulse generating circuit 19 which outputs the complementary control pulse signals PT and /PT by receiving the output pulse CLKSTINT from the clock receiver 11, the driver 20 which outputs the internal clock INTCLKT by receiving the output pulse STCLKT from the backward pulse delay line 16, the state-holding initialization circuit 21 which controls the initialization of the state-holding circuits 17 in the state-holding section 18 state-holding section control circuit 22 which controls the extension of the delay time in the operation of the state-holding section 18 and in the delay monitor 12, and the input cut-off circuit 23.

In this case, the control pulse generating circuit 19 further has the function of generating the dummy control pulse DMY PT on the basis of a control signal GATEBT generated in the after-mentioned FCLT gate control circuit 31. This dummy control pulse DMY PT is supplied to the forward pulse delay line 14, controlling the forward pulse delay line 14 by reset.

The state-holding section control circuit 22 generates the pulse /PMT to reset the state-holding section 18 by receiving the control pulse /PT generated in the above-mentioned control pulse generating circuit 19, and detects the backward pulse STCLKT outputted from the backward pulse delay line 16, generating a control signal FCLCTLT on the basis of the result of this detection. This control signal FCLCTLT is supplied to the delay monitor 12, and is used to control the extension of he delay time in the delay monitor 12.

Also the AND circuit 25 in the input cut-off circuit 23 is changed from the afore-mentioned 2-input type to 3-input type. In addition to the output pulse CLKSTINT from the clock receiver 11 and the signal QAT outputted from the shift: register 24, a control signal STBYYAT outputted from t-he after-mentioned standby-countermeasure gate control circuit is inputted to this 3-input type AND circuit 25, causing the AND circuit 25 to generate a signal by taking the AND logic from these input signals and outputting this signal to the backward pulse delay line 16.

Furthermore, the clock synchronous circuit related to the form of this embodiment is different from that of the afore-mentioned FIG. 1 in that an AND circuit 26 (the first gate circuit) is inserted between the clock receiver 11 and the delay monitor 12, in that an AND circuit 27 (the second gate circuit) is inserted between the delay monitor 12 and the forward pulse delay line 14, in that an AND circuit 28 (the third gate circuit) is inserted between the clock receiver 11 and the control pulse generating circuit 19, and in that a PD (Power Down)-countermeasure gate control circuit 29, a standby-countermeasure gate control circuit 30 and an FCLT gate control circuit 31 are newly provided to generate control signals for controlling these three AND circuits 26, 27 and 28, as shown in FIG. 6B.

To the above-mentioned AND circuit 26, in addition to the output CLKSTINT from the clock receiver 11, a control signal GATEAT, which are generated in the PD-countermeasure gate control circuit 29, and "H" signal are inputted. It should be noted that although this AND circuit 26, using 3-input type from the viewpoint of circuit design in the same way as the AND circuit 28, gets extra input of H" signal, it is not necessary to input "H" signal to the AND circuit 26 if 2-input type is used.

To the above-mentioned AND circuit 27, in addition to an output signal DMOUTT from the delay monitor 12, a control signal GATEBIT generated in the FCLT gate control circuit 31 is inputted.

To the above-mentioned AND circuit 28, in addition to the output CLKSTINT from the clock receiver 11, the control signal GATEAT generated in the PD-countermeasure control circuit 29 and a control signal STBYAT generated in the standby-countermeasure gate control circuit 30 are inputted.

The above-mentioned PD-countermeasure gate control circuit 29 generates the control signal GATEAT by receiving the signal CKEIN (power down mode signal), which received at the receiver the control signal CKE inputted from the outside to control the power down mode, as well as the output CLKSTINT from the clock receiver 11.

The above-mentioned standby-countermeasure gate control circuit 30, with the memory to be mounted with this clock synchronous circuit which is the memory having a multiple number of banks whose operation is controlled on the basis of the internal clock, generates the control signal STBYAT and STBYBT by receiving a signal /DOENB which shows whether a READ data is outputted or not in an internal circuit of the memory, a signal BKOR which shows which bank is active or not, a signal /ACTV which shows whether the bank is in the bank active state or not by having the level determined at a faster timing than this signal BKOR, and the output signal DMOUTT from the delay monitor 12, and the output CLKSTINT from the clock receiver 11.

The above-mentioned FCLT gate control circuit 31 generates the control signal GATEBT by receiving the control signal GATEAT generated in the above-mentioned PD-countermeasure gate control circuit 29, the output CLKSTINT from the clock receiver 11 and the control signal STBYBT generated in the above-mentioned standby-countermeasure gate control circuit 30.

The delay monitor 12 has the delay time (Trc+Tdr) which is substantially equal to the sum of the delay time Trc in the clock receiver 11 and the delay time Tdr in the driver 20. Or the delay monitor 12 has the delay time (Trc+Tdr) which is substantially equal to the sum of the delay time Trc in the clock receiver 11, the delay time Tdr in the driver 20, and the delay time during the time when data are being outputted in the internal circuit of the memory whose operation is controlled by using the internal clock INTCLKT, for example, in the data output circuit after the internal clock INTCLKT has been given.

A pulse width of the pulse outputted from the delay monitor 12 is so design that it will be adjusted (extended) according to the control signal FCLCTLT outputted from the state-holding section control circuit 22.

The control pulse generating circuit 19, receiving the output from the above-mentioned AND circuit 28 and the control signal GATEBT generated by the FCLT control circuit 31, generates the dummy control pulse signal DMY PT on the basis of these signals in addition to the complementary control pulse signals PT and /PT which have the pulse width Wp. A pulse width of the control signal PT is established so that it will become shorter than the above-mentioned duration of (Trc+Tdr).

Next, we will explain about the detailed configuration of the respective circuits in FIGS. 6A and 6B.

FIG. 7 is the circuit diagram showing the detailed configuration of the PD-countermeasure gate control circuit 29 in FIG. 6B. This circuit includes of two 2-input NAND circuits 41 and 42 and one inverter 43. The above-mentioned two NAND circuits 41 and 42 have the input-output node cross-connected so that the respective outputs become the input of the other circuit, forming flip-flop. And the signal CKEIN for controlling the power down mode is inputted to the NAND circuit 41, and the signal CLKSTINT from the clock receiver 11 is inputted to the NAND circuit 42 respectively. And the output of the NAND circuit 41 is inputted to the above-mentioned inverter 43, which generates the control signal GATEAT.

FIG. 8 is the circuit diagram showing the detailed configuration of the standby-countermeasure gate control circuit 30 in FIG. 6B. In this diagram, the NAND circuit 44 and the circuit comprised of an even number of the inverters 45 connected in series constitute the pulse generating circuit, which generates a pulse signal N1 having the designated pulse width on the basis of the signal /ACTV that indicates whether the bank is in the bank active state or not. The pulse signal N1 generated in this pulse generating circuit is supplied to a 3-input NOR circuit 46, together with the signal/DOENB which shows whether READ data is outputted in the memory internal circuit or not and the signal BKOR which shows which bank is in the bank active state or not.

Two 2-input NAND circuits 47 and 48 also constitute flip-flop with the input-output node cross-connected so that the respective outputs become the input of the other, while an output N2 from the above-mentioned NOR circuit 46 is inputted to the NAND circuit 47 and the signal DMOUTT from the delay monitor 12 is inputted to the NAND circuit 48 respectively. And an output of the NAND circuit 47 is inputted to an inverter 49, which outputs the control signal STBYBT. Furthermore, the output from the NAND circuit 47 is inputted to a clocked inverter 50. And by getting the output from this clocked inverter 50 latched in a latch circuit LC which is comprised of two inverters and one clocked inverter, the control signal STBYAT is outputted.

The operation of the above-mentioned clocked inverter 50 is controlled by a complementary clock CLKINGT and /CLKINGt. These two clocks are obtained by reversing in turn the afore-mentioned clock CLKSTINT by two inverters 51 and 52 which are connected in series.

Figure 9:
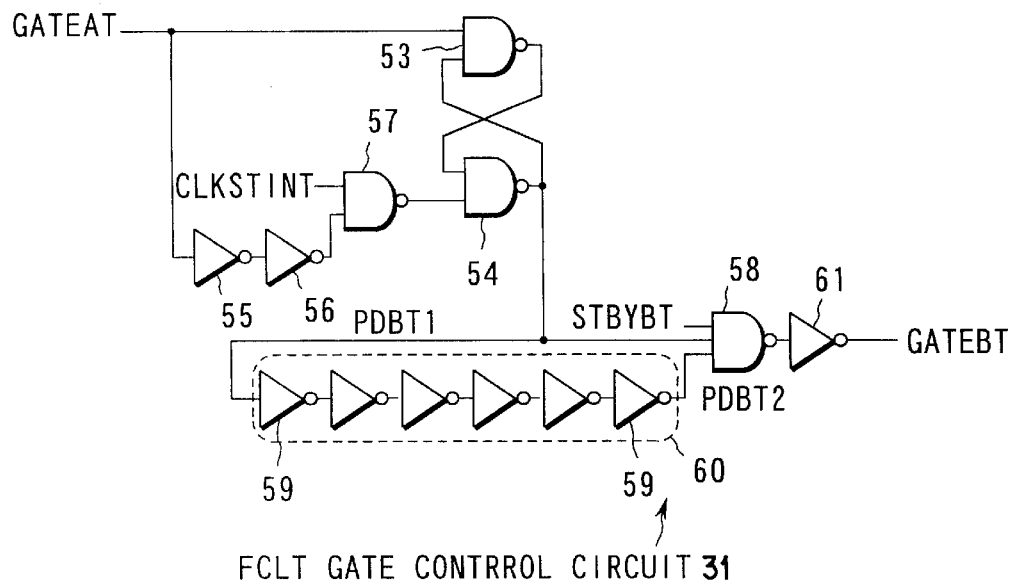
FIG. 9 is the circuit diagram showing the detailed configuration of the FCLT gate control circuit in FIG. 6B.

FIG. 9 is the circuit diagram showing the detailed configuration of the FCLT gate control circuit 31 in FIG. 6B. In this diagram, two 2-input NAND circuits 53 and 54 have the input-output node cross-connected so that the respective outputs become the input of the other, constituting flip-flop. To the other input node of the above-mentioned NAND circuit 53, the control signal GATEAT generated in the afore-mentioned PD-countermeasure control circuit 29 is inputted. The control signal GATEAT is also inputted to one input node of a 2-input NAND circuit 57 by way of the serially connected two inverters 55 and 56. To the other input node of the NAND circuit 57, the afore-mentioned clock CLKSTINT is inputted. And an output of the NAND circuit 57 is inputted to the other input node of the NAND circuit 54.

Furthermore, an output PDBT1 of the above-mentioned NAND circuit 54 is directly inputted to one input node of a 3-input NAND circuit 58, and is delayed for a designated duration by a delay circuit 60, which is comprised of an even number of serially connected inverters 59, and is inputted to the other input node of the NAND circuit 58 as, a signal PDBT2. Also to the remaining one input node of the NAND circuit 58, the control signal STBYBT generated by the standby-countermeasure gate control circuit 30 in FIG. 6B is inputted. And an output of the above-mentioned NAND circuit 58 is inputted to a inverter 61, which outputs the control signal GATEBT.

Figure 10:
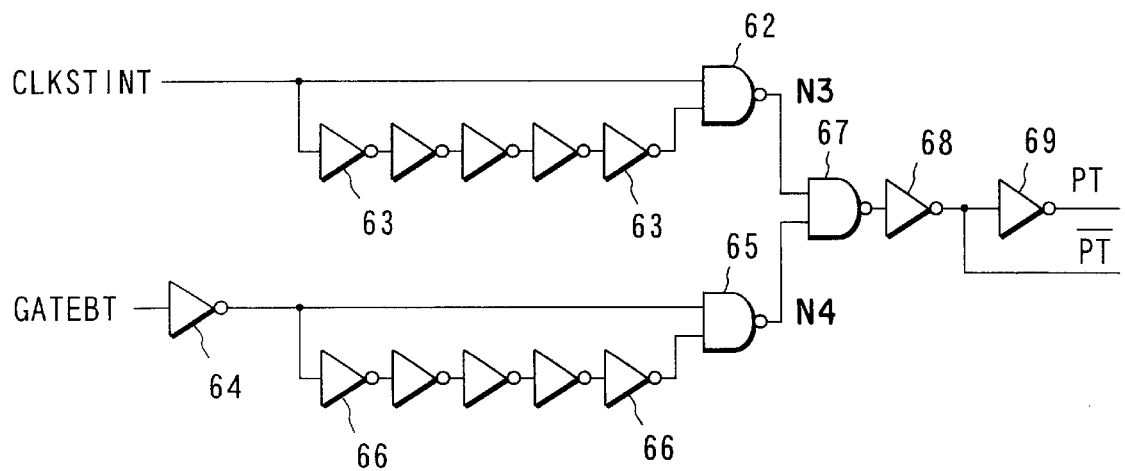
FIG. 10 is the circuit diagram showing the detail configuration of the control pulse generating circuit in FIG. 6B.

FIG. 10 is the circuit diagram showing the detailed configuration of the control pulse generating circuit 19 in FIG. 6A. In this diagram, a NAND circuit 62 and an odd number (five units in this case) of serially connected inverters 63 constitute a pulse generating circuit, which generates a pulse signal N3 having the designated pulse width, on the basis of the output CLKSTINT from the clock receiver 11 inputted through the AND circuit 28 in FIG. 6A. Furthermore, an inverter 64, a NAND circuit 65, and an odd number (five units in this case) serially connected inverters 65 constitute a pulse generating circuit, which generates a pulse signal N4 with the designated pulse width, on the basis of the control signal GATEBT generated in the FCLT gate control circuit 31 in FIG. 6B.

The above-mentioned pulse signals N3 and N4 are both inputted to a NAND circuit 67, and an output from the NAND circuit 67, inverted by an inverter 68, generates the control pulse /PT, and the control pulse /PT further inverted by an inverter 69, outputs the control pulse PT.

Next, we will explain the operation of the clock synchronous circuit in FIGS. 6A and 6B. First, external signal CKE and the internal control signal CKEIN fall to "L", the power down entry takes place and after that with the lapse of a certain time with the rise of the signal CKEIN to "H", the power down exit will take place. We will explain the operation of this power down exit by referring to the waveform diagram in FIG. 11.

Figure 11:
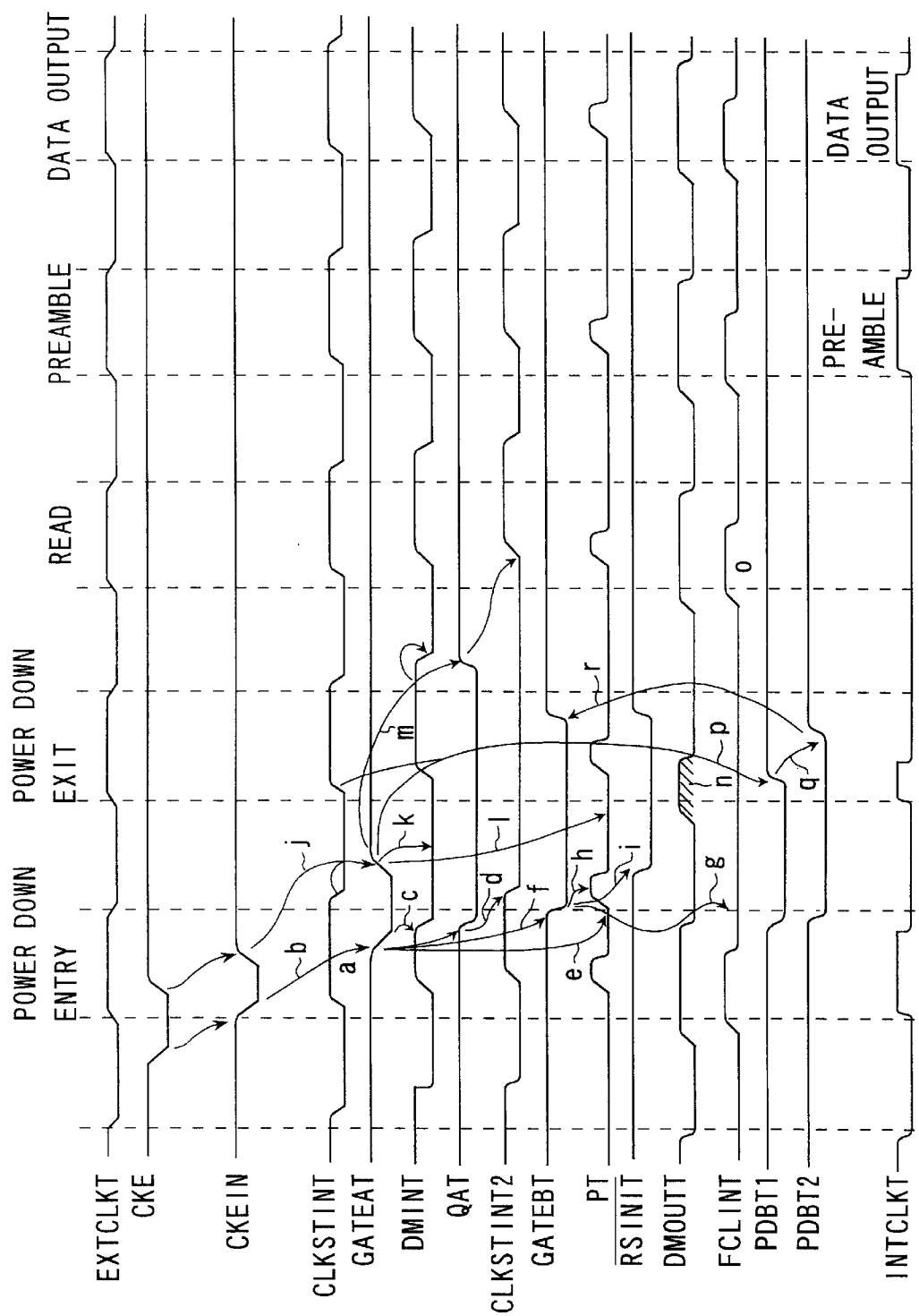
FIG. 11 is the waveform diagram showing the example of one operation of the clock synchronous circuit in FIGS. 6A and 6B.

With the power down entry the clock receiver 11 stops operation, and its output CLKSINT is fixed, for example, at "H" (FIG. 11-a). In order that the stop level of the output CLKSINT of the receiver 11 can be either "H" or "L", the "L" signal is always supplied to the circuit subsequent to the receiver 11. In real terms, the PD-countermeasure gate control circuit 29, which has been subjected to the power down entry, sets the control signal GATEAT to "L", to close the AND circuits 26 and 28 as well as the AND circuit 25 in the input cut-off circuit 23. Also in the input cut-off circuit 23, this control signal GATEAT is inputted to the shift register 24, causing the output QAT of the shift register 24 to be set to "L". By this operation, the output DMINT of the AND circuit 26, the output from the AND circuit 28 and the output CLKSINT2 of the AND circuit 25 are all fixed at "L", and by having the output of the AND circuit 28 fixed at "L", the control pulse signal PT is also fixed at "L" (FIG. 11-c, 11-d, 11-e).

After that the control signal GATEBT outputted from the FCLT gate control circuit 31, which has received the control signal GATEAT, turns into "L" (FIG. 11-f). And the output of the AND circuit 27, which receives this control signal GATEBT, also turns into "L" (FIG. 11-g). Furthermore, the control pulse generating circuit 19, which has received this control signal GATEBT, outputs from the output end of the control pulse PT the dummy control pulse DMY PT which performs like the control pulse PT to stop the propagation of the forward pulse in the forward pulse delay line 14 (FIG. 11-h). This dummy control pulse DMY PT is generated as the pulse signal N4 by the pulse generating circuit comprised of the inverter 64, the NAND circuit 65 and the inverter 66 in the control pulse generating circuit 19 shown in FIG. 10. This pulse signal N4, by going through the NAND circuit 67, and inverters 68 and 69, is outputted from the output end of the control pulse PT.

Receiving this control pulse PT (dummy control pulse DMY PT), the forward pulse delay line 14 is reset, and forward pulses propagating through the forward pulse delay line 14 all disappear. After that, the state-holding section initial circuit 21, which has received the control signal GATEBT, set the internal control signal /RSINIT (not shown in FIGS. 6A and 6B) to "L" on the basis of this control signal GATEBT, resetting all the state-holding circuits 17 in the state-holding circuit 18 by this internal control signal.

Also with the control signal GATEBT set to "L", the output FCLINT of the AND circuit 27 turns into "L".

As described above, after the power down entry, the outputs from the AND circuits 26, 27, and 28 all turn into "L", preventing the clock from being propagated to the circuits subsequent to these respective AND circuits 26, 27 and 28. Furthermore, by the control pulse generating circuit 19 and the mode-holding section initialization circuit 21, the state-holding section 18 and the forward pulse delay line 14 are reset.

Next, after the lapse of a certain time following the power down entry, the external signal CKE and the internal signal CKEIN rise to "H", and the power down exit takes place. Following the power down exit, the control signal GATEAT outputted from the PD-countermeasure gate control circuit turns into "H" (FIG. 11-j).

However, regardless of the timing of the power down exit, in order to input the clock which will satisfy the cycle, the PD-countermeasure gate control circuit 29 changes the control signal GATEAT to "H" after detecting that the clock CLKSTINT outputted from the receiver 11 is "L". When the control signal GATEBT turns into "H", the fixed state at "L" of the output of the AND circuits 26 and 28 is released, changing to the mode which passes the output from the receiver 11 (FIG. 11-k, 11-l).

Meanwhile, with the control signal GATEAT turning into "H", the shift register 24 in the input cut-off circuit 23, which has been cleared, is released from the clear state, after which only the clock in the first cycle outputted from the receiver 11 as described before is cut off, and the AND circuit 25 changes to the mode which passes the clock in the second cycle and subsequent cycles (FIG. 11-m).

Meanwhile, after the AND circuit 26 has changed to the mode which passes the output from the receiver 11, the FCLT gate control circuit 31 turns the control signal GATEBT to "H" at the timing when the designated delay time has passed.

The above-mentioned designated delay time equals to the sum of the time spent when in the FCKT gate control circuit 31 shown in FIG. 9, the level of the control signal GATEAT changes, and after that the output of the inverter 55 is inverted, and further till the level of the pulse CLKSTINT in the NAND circuit 57 is detected, and the delay time between the signal PDPBTI determined by the delay circuit 60 comprised of the serially connected inverter 59 and the signal PDBT2.

When the control signal GATEBT changes to "H", the state-holding section initialization circuit 21 releases the reset operation of the state-holding section 18 to prepare for the set operation of the first forward pulse. Furthermore, when the control signal GATEBT changes to "H", the ADN circuit 27 opens and lets the output DMOUTT from the delay monitor 12 pass, and inputs it as the forward pulse FCLINT to the forward pulse delay line 14.

At this point, the AND circuit 26, which is the gate on the input side of the delay monitor 12, is opened, and after the lapse of the designated delay time from then, the AND circuit 27, which is the gate on the output side of the delay monitor 12, is opened. This operation is for the purpose of preventing such a situation as when the power down time is short, the clock before the power down which is left in the delay monitor 12 (FIG. 11-n or the diagonally shaded portion to the signal DMOUTT) is inputted to the forward pulse delay line 14 after the power down exit, and propagates through the forward pulse delay line 14, thus setting the state-holding section 18 to the set state. In other words, this operation is to prevent the clock before the power down entry which is remaining in the delay monitor 12 from being inputted to the forward pulse delay line 14 (Delay monitor— clear) even if the AND circuit 26 is closed with the power down entry and the power down exit takes place while the "L" output of this AND circuit 26 propagates up to the output of the delay monitor 12.

As a result of this operation, even if the power down time is short, only the clock after the power down exit will propagate to the forward pulse delay line 14 (FIG. 11-o).

Next, we will explain the method of generating the above-mentioned delay time by referring to FIG. 9 in real terms.

First, after the control signal GATEBT has risen to "H", the propagation of the first clock, which must be supplied to the forward pulse delay line 14, as the output CLKSTINT of the receiver 11 is detected. When this is detected, the output PDBT1 of the flip-flop comprised of the NAND circuits 53 and 54 turns into "H" (FIG. 11-p). The clock detected at this point begins to propagate through the delay monitor 12, but the most late timing for opening the AND circuit 27 is the timing when the above-mentioned clock passing the delay monitor 12 is about to reach the AND circuit 27. Accordingly, even if the signal PDBT1 turns into "H", the AND circuit 27 does not open immediately, and is delayed by the delay time a which is obtained by the delay circuit 60 comprised of an even number of serially connected inverters 59 in FIG. 9, to wait for the signal PDBT1 to turn into "L" (FIG. 11-q). When the signal PDBT2 turns into "H", the control signal GATEBT turns to "H" (FIG. 11-r), after which the AND circuit 27 opens.

Incidentally, in order to improve the precision of synchronization, the delay time in the delay monitor 12 is being extended. Following this extension, the optimum time for opening the AND circuit 27 to clear the delay monitor 12 will change. In this case, the adjustment of the delay time will become easy by changing the number of stages of the inverters in the delay circuit 60 in FIG. 9 following the change in the delay time in the delay monitor 12.

The foregoing describes the method of stopping the control in the active power down mode.

Figure 12:
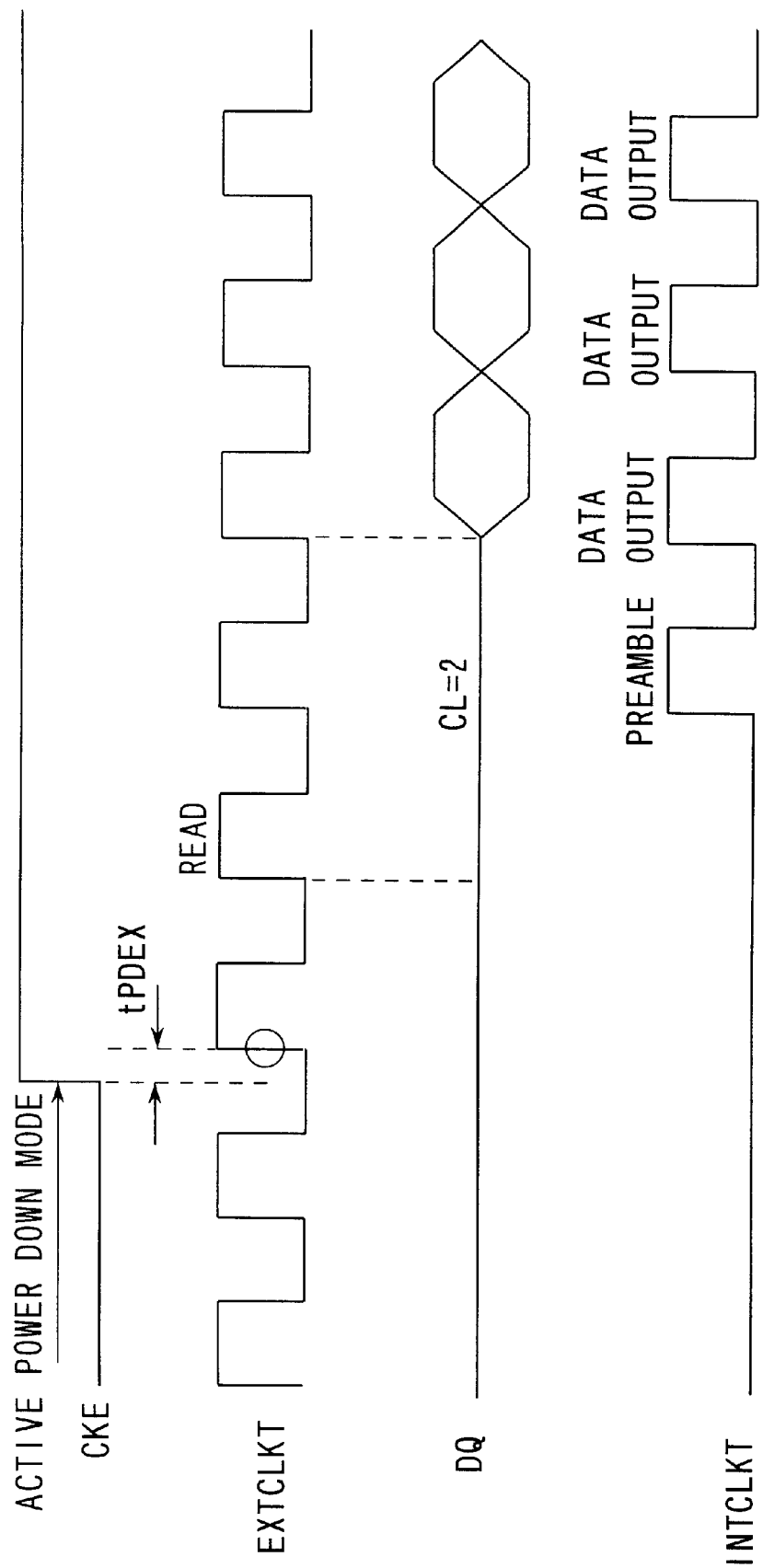
FIG. 12 is the timing chart showing the example of one operation of the DRAM having the active power down mode.

FIG. 12 is the timing chart showing the relation between the READ command after the active power down exit and the internal clock in the memory, especially in the double data rate synchronous DRAM having the active power down mode. This DRAM allows the READ command to be inputted from the second clock cycle after the power down exit. If the minimum number of cycles from the READ command to the data output (DQ) is two cycles (CL-2), the set operation (called preamble) of a data strobe signal DQS for receiving and sending data on the side of the memory controller is carried out at the third clock cycle. In other words, the internal clock is needed at the third clock cycle. Accordingly, in order to generate the internal clock at the third clock cycle of the external clock, it is necessary to fetch in the clock synchronous circuit the "H" edge of the first clock cycle marked with a circle in FIG. 12. It is necessary to define the setup time (tPDEX in FIG. 12) of the power down exit as shown in the following in order to fetch the "H" edge.

$$tPDEX-(tRECEX+tGCTL)-tREC$$

The tRECEX is a time required for the receiver 11 in FIG. 6A to reactivate with the power down exit, and tGCTL is a delay time in the PD-countermeasure 29 which generates the control signal GATEAT for controlling the operation of the AND circuit 26 in the FIG. 6A, and tREC is a delay time in the receiver 11.

The stop control of the clock synchronous circuit in the active power down mode above can be said to be the stop control when the "H" edge of the external clock at two cycles before the needed internal clock can be fetched in the clock synchronous circuit under any conditions.

As described above, as it is possible to stop the operation of the entire clock synchronous circuit, effect of power reduction is great. However, in the case of the clock synchronous circuit having the delay monitor, if the operation of the entire circuit is stopped and the stop time is short, the delay monitor having comparatively long delay time may cause the clock left before the stop to hinder the synchronous operation after the reactivation.

However, in the clock synchronous circuit of the above-mentioned embodiment, the gates (AND circuits 25 and 27) are provided, and will ensure the establishment of the synchronization after the reactivation even if the stop time is short.

Figure 13:
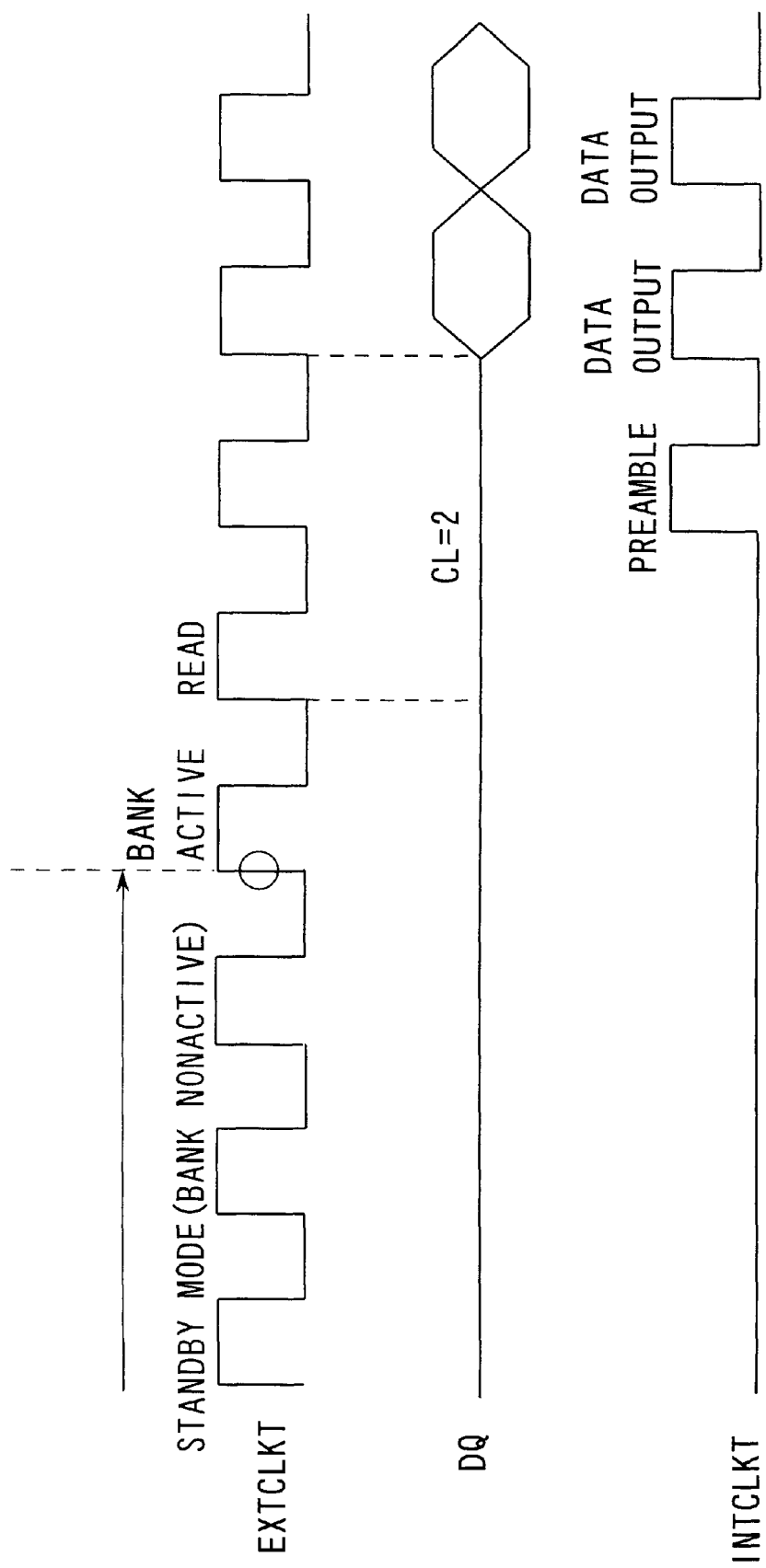
FIG. 13 is the timing chart showing the example of one operation of the DRAM having active power down mode.

Next, we will explain about the control of the operation stop of the STBD in the standby mode. As described above, standby means the state of the command accepted in the state where any bank of the memory is not active. Accordingly, in order to stop the operation of the clock synchronous circuit during the standby mode, it is necessary to detect the state where all the banks are not active. However, even if all the banks are not active, the internal clock, being used as the output timing signal of the READ data, cannot be stopped during the burst read operation of the READ data. Accordingly, in this case, it is necessary to detect a signal which shows that the output of the READ data is finished. It is therefore necessary to start the stop control of the clock synchronous circuit by detecting these two states and signal. Let us assume that the signal for reactivation is the bank active signal. FIG. 13 is the timing chart showing the relation between the READ command out of the standby mode and the internal clock. When the cycle τ of the external clock EXTCLKT is long enough, it is assumed that it is permissible to enter the READ command at the clock next to the bank active state. In this case, the internal clock for the preamble at two cycles after the bank active state will become necessary. That is, it is necessary to fetch the "H" edge of the external clock in the clock synchronous circuit at the cycle which induces the bank active state. However, compared with the time required for the "H" edge of the external clock, which must be fetched, to reach the entrance of the delay monitor 12 as "H" of the pulse CLKSTINT, the time required for detection of the bank active state of the reactivation signal is very long. Accordingly, if the stop control of the clock synchronous circuit in the active power down mode is used as it, there will arise a problem that the timing of opening the AND circuit 26 does not match the timing of the clock to be fetched in. In order to solve such a problem, in the clock synchronous circuit of the above-mentioned embodiment, it is so designed that only the delay monitor 12 is kept operating during the standby mode while the other circuits are stopped. By keeping the delay monitor 12 operating, it always becomes possible to make the clock to be fetched in propagate to a front of the forward pulse delay line 14. The control will be made so that while the clock is passing through the long signal delay route in the delay monitor 12, the bank active state is detected and the stopped circuits are reactivated.

In the standby-countermeasure control circuit 30 shown in FIG. 8, the signal N2 is the signal obtainable on the basis of the result of detection of the stop and reactivation in the standby mode. Whether READ data are outputted or not is determined by detecting the signal /DOENB. In other words, this signal /DOENB becomes "H" during the output of READ data and turns into "L" when the output is finished. Also the signal BKOR is the signal which becomes "H" during the bank active state and which turns into "L" during the non-active mode. Furthermore the signal /ACTV is the signal which assists the signal BKOR. In the configuration of the memory circuit, the time required from the non-active mode till the signal BKOR turns into "H" is very long. Thus the signal /ACT is used to detect the non-active mode temporarily beforehand so that the clock to be fetched can be reactivated with sufficient time to spare within the time when the clock passes through the delay monitor 12. What is put together after taking the OR logic from such a signal is the above-mentioned signal N2.

Next, we will explain the operation of the clock synchronous circuit in FIGS. 6A and 6B when the bank is made active in the standby mode. Let us assume a case where all the banks are made non-active under the condition in which READ data are not outputted from the memory, the clock synchronous circuit stops operation, and after that a certain bank is made active again, reactivating the clock synchronous circuit.

Figure 14:
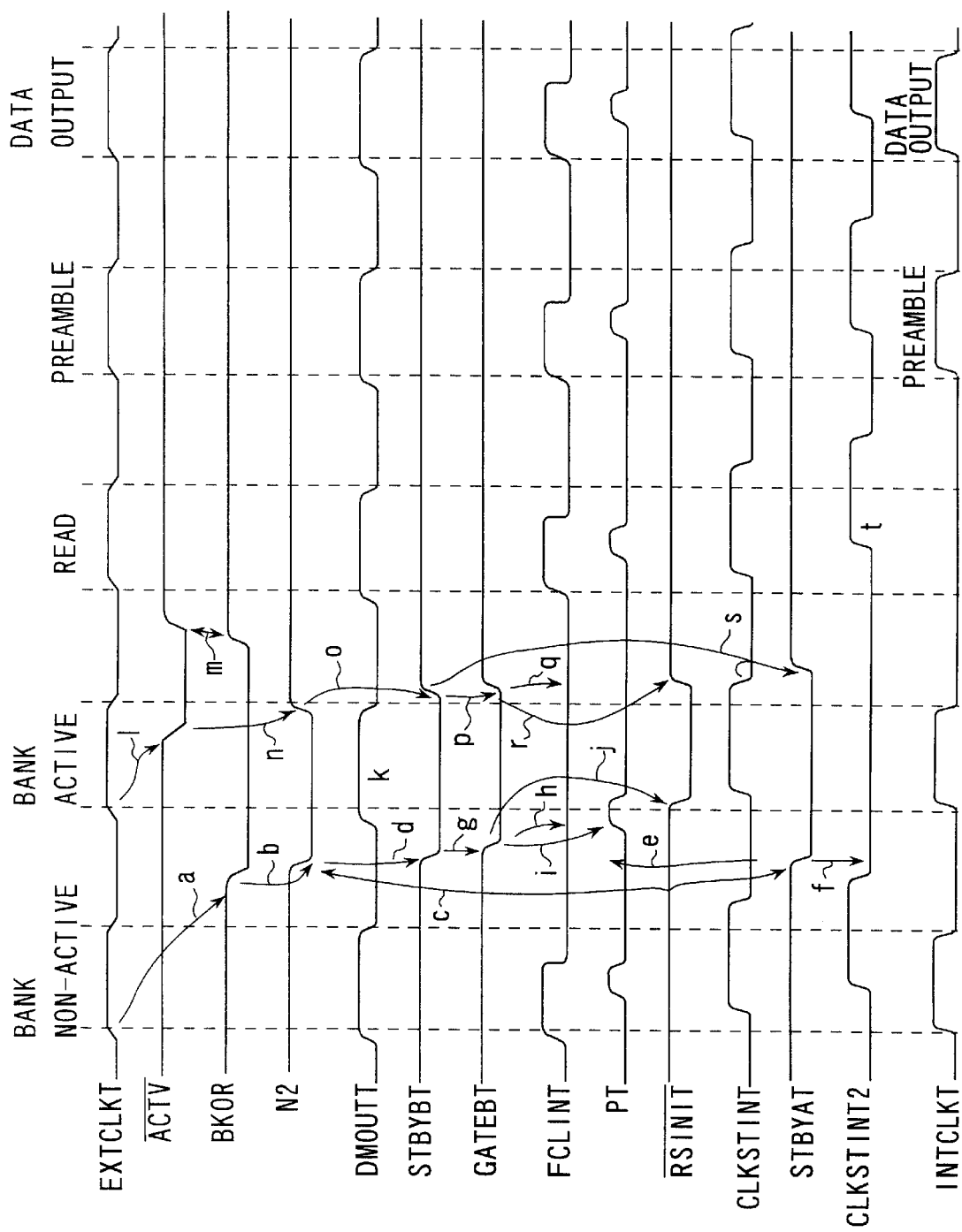
FIG. 14 is the waveform diagram showing the example of an operation at the time of standby mode in the clock synchronous circuit in FIGS. 6A and 6B.

FIG. 14 is the waveform diagram which is used to explain the stop control operation in the standby mode. If all the banks are turned to the non-active state under the condition where READ data are not outputted (the signal /DOENB is "L"), the signal BKOR turns to "L" (FIG. 14-a), causing the signal N2 to turn into "L" (FIG. 14-b). This operation causes the output of the NAND circuit 47 comprising the flip-flop to turn into "H", also turning into "L" both the signals STBYAT and STBYBT which are the outputs of the clocked inverter 50 and the inverter 49 following it (FIGS. 14-c and 14-d). At this point, in the complementary clock controlling the operation of the clocked inverter 50, the clock CLKINGT is set to "L" and the clock /CLKINGT to "H". When the control signal STBYAT turns into "L", the AND circuits 28 and 25 in FIG. 6A, which receive this signal, are closed, and the control pulse signal PT outputted from the control pulse generating circuit 19, which receives output from the AND circuit 28, and the output CLKSINT2 of the AND circuit 25 both turn into "L" (FIGS. 14-g and 14-f). On the other hand, when the control signal STBYBT turns into "L", the output of the NAND circuit 58 in the FCLT gate control circuit 31, which receives this signal STBYBT, turns into "H", and the control signal GATEBT outputted from the inverter 61 following it turns into "L" (FIG. 14-g). When this signal GATEBT is received, the AND circuit 27 in FIG. 6A is closed, and its output FCLINT turns into "L" (FIG. 14-h). Furthermore, after receiving the control signal GATEBT, the control pulse generating circuit 19 generates only once the dummy control pulse DMY PT which is similar to the control pulse signal PT used to stop the propagation of the forward pulse (to reset the forward pulse delay line 14) (FIG. 14-i). And by inputting this dummy control pulse signal DMY PT, the forward pulse delay line 14 is reset, causing the forward pulse propagating there to disappear completely. After that, receiving the control signal GATEBT, the state-holding section initialization circuit 21 turns the internal signal /RSINIT for initialization to "L" (FIG. 14-j), initializing (resetting) the state-holding section 18.

In this case, like the time of the active power down mode, the AND circuit 26 is not closed. Accordingly, during the standby mode, the output CLKSTINT from the clock receiver 11 is constantly supplied to the delay monitor 12, causing the delay monitor 12 to output DMOUTT all the time (FIG. 14-k).

Let us assume that in the cycle next to the non-active cycle, a certain bank is made active. When this non-active state turns the signal /ACTV into "L" (FIG. 14-l), the output signal N1 of the NAND circuit 44 in the standby-countermeasure gate control circuit 30 shown in FIG. 8 turns into "H", and the output signal N2 of the OR circuit 46 following this will also turn into "H" (FIG. 14-m). The pulse width of the signal /ACTV is set to the width which makes it possible to detect the rise of the signal BKOR without fail so that the signal N2 will not turn into "L" again with the signal /ACTV turning into "L" (FIG. 14-n). After the signal N2 has turned into "H", detect that the output DMOUTT of the delay monitor 12, which is the signal ahead of the AND circuit 27 in FIG. 8, is "L". Detection of this signal DMOUTT is executed in the NAND circuit 48 in the standby-countermeasure gate control circuit 30. And when detecting that this signal DMOUTT is "L", the control signal STBYBT outputted from the standby-countermeasure gate control circuit 30 turns into "H" (FIG. 14-o), which in turn causes the control signal GATEBT outputted from the FLCT gate control circuit 31 to turn into "H" (FIG. 14-p). When the control signal GATEBT turns into "H", the AND circuit 27 receiving it will open (FIG. 14-q). Furthermore, receiving this control signal GATEBT, the state-holding section initialization circuit 21 will release the initialization of the state-holding section 18, preparing for the set operation of the state-holding section 18 by the first forward pulse (FIG. 14-r). In the meantime, the operation for opening the AND circuits 28 and 25 is executed after opening the AND circuit 27 and further detecting that the output CLKSTINT has turned into "L" (FIG. 14-s). If the above-mentioned operation for opening the AND circuits 28 and 25 is executed simultaneously with the operation for opening the AND circuit 27, with the output CLKSTINT of the receiver 11 being "H" depending on the condition, there are cases where the output of the receiver 11 is inputted to the backward pulse delay line 16 before the first forward pulse propagates. Then, the mis-operation of the pulse width extension function as described in the clock synchronous circuit in FIG. 1 will take place even in this case. Accordingly, it is necessary to detect the "L" of the output CLKSTINT of the receiver 11 so that the output of the receiver 11 is inputted to the backward pulse delay line 16 from the next cycle (FIG. 14-t) without fail.

Now, there exists in the DRAM a refresh operation which rewrites the data stored in the memory cell. As this refresh operation is executed in the bank active state, the clock synchronous circuit will operate during the refresh operation if the ordinary bank active control is used. In the refresh operation, the internal clock outputted by the clock synchronous circuit is not needed. Accordingly, if the bank active signal BKOR, which ignores the bank active by the refresh operation, is used as a detection signal for the stop control of the clock synchronous circuit, it will become possible to stop the clock synchronous circuit even during the refresh operation by the same control as the control in the standby mode.

Next, we will briefly explain the operation in a case where all the banks are turned into the non-active mode (the signal BKOR turned into "L") during the burst read operation of the READ data (with the signal /DOENB turned into "H"). As the signal /DOENB is "H" and the signal N2 in FIG. 8 is turned into "H", even if the signal BKOR is turned into "L", the STBD will not start the stop control operation until data output is finished. When the data output is finished and the signal /DOENB turns into "L", the signal N2 is reversed and the stop control of the STBD will commence. We will omit explanation below regarding the operation upto reactivation as this is the same case where the stop control is commenced with all the banks in the non-active mode.

The stop control method at the time of standby as described above is the method for the stop control under the condition where the "H" edge of the external clock at two cycles before the internal clock needed cannot be fetched if the entire system is stopped. Even during the stop operation, restart while the clock to be fetched in is passing through the delay monitor 12 by keeping the clock receiver 11 and the delay monitor 12 operating. In the case of the clock synchronous circuit having the delay monitor 12 as shown in FIG. 6A, such a control operation is possible.

Figure 15:
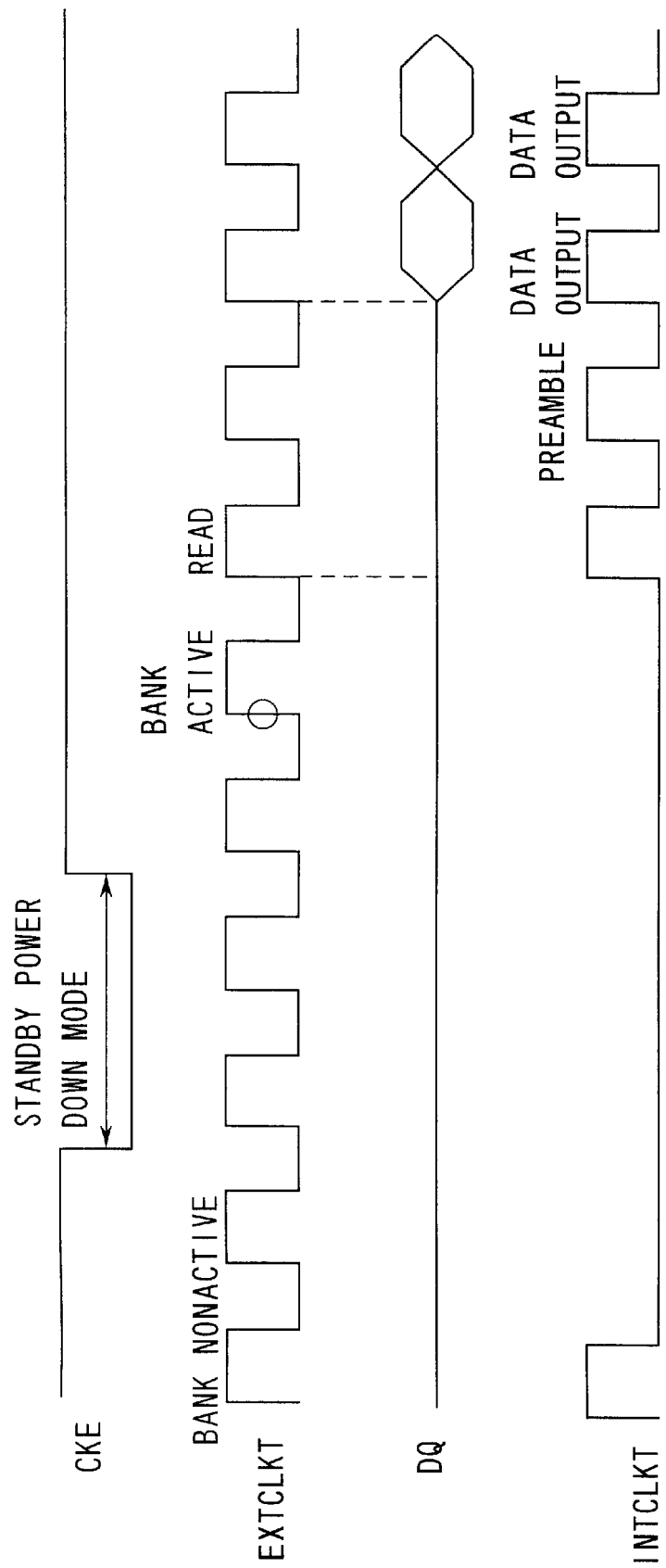
FIG. 15 is the timing chart showing the example of one operation of the DRAM having the standby power down mode.

Next, we will explain about the stop control operation in the standby power down mode. FIG. 15 is the waveform diagram showing the relation between the READ command and the internal clock from the standby power down entry to after the standby power down exit. In execute the stop control operation, the circuits other than the delay monitor 12 stop operating at the point in time when the standby mode is entered, and then the delay monitor 12 also stops operation with the power down entry. Reactivation is the stop condition where only the delay monitor 12 is operating only with the power down exit, the whole system are reactivated with the bank active mode. After all, the stop control operation in the standby power down mode is a fusion of the afore-mentioned active power down mode and the stop control operation at the standby mode. If a control circuit for executing these two control operations is provided, there will be no special need for adding a new control circuit. The internal clock needed is the fourth clock cycle from the power down exit, and there will be room to spare by one clock for output in advance.

Figure 16A:
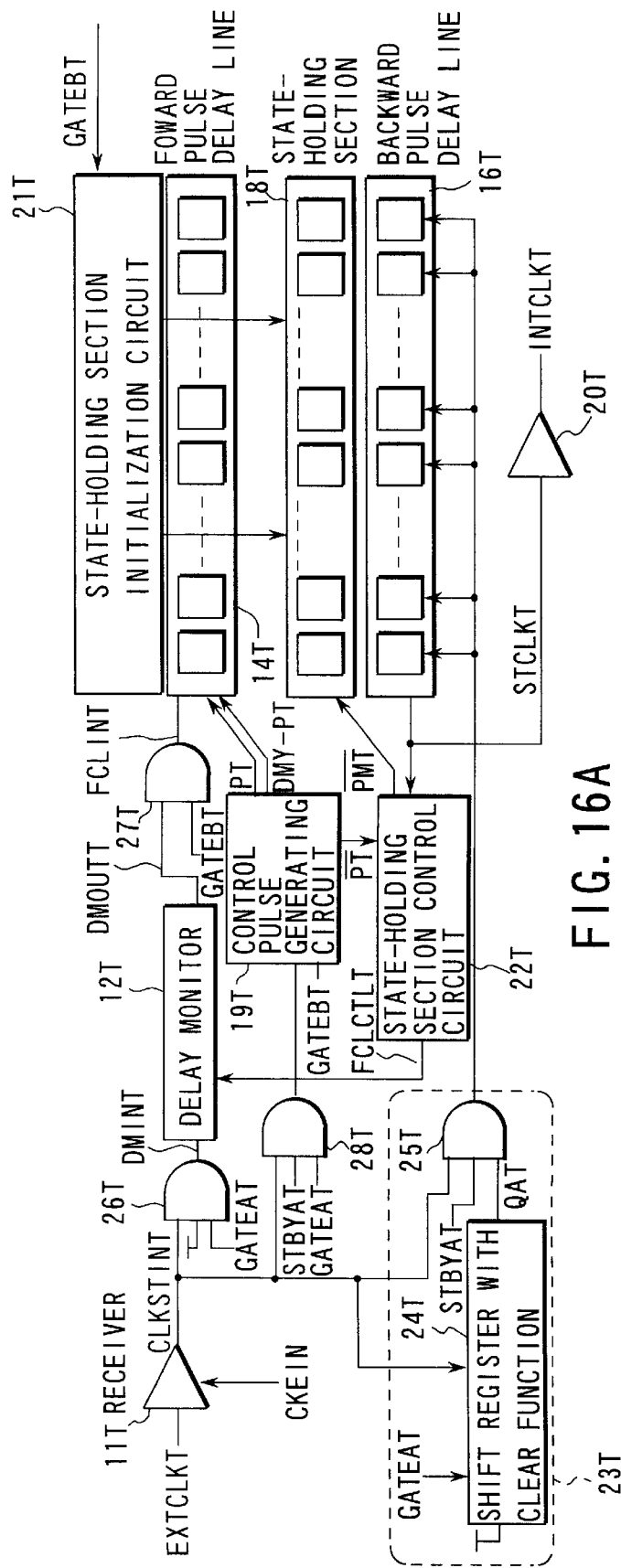
FIGS. 16A through 16C are the block diagrams of the clock synchronous circuits which are mounted on the double data rate synchronous DRAM in the form of the second embodiment of the present invention.
Figures 16B, 16C:
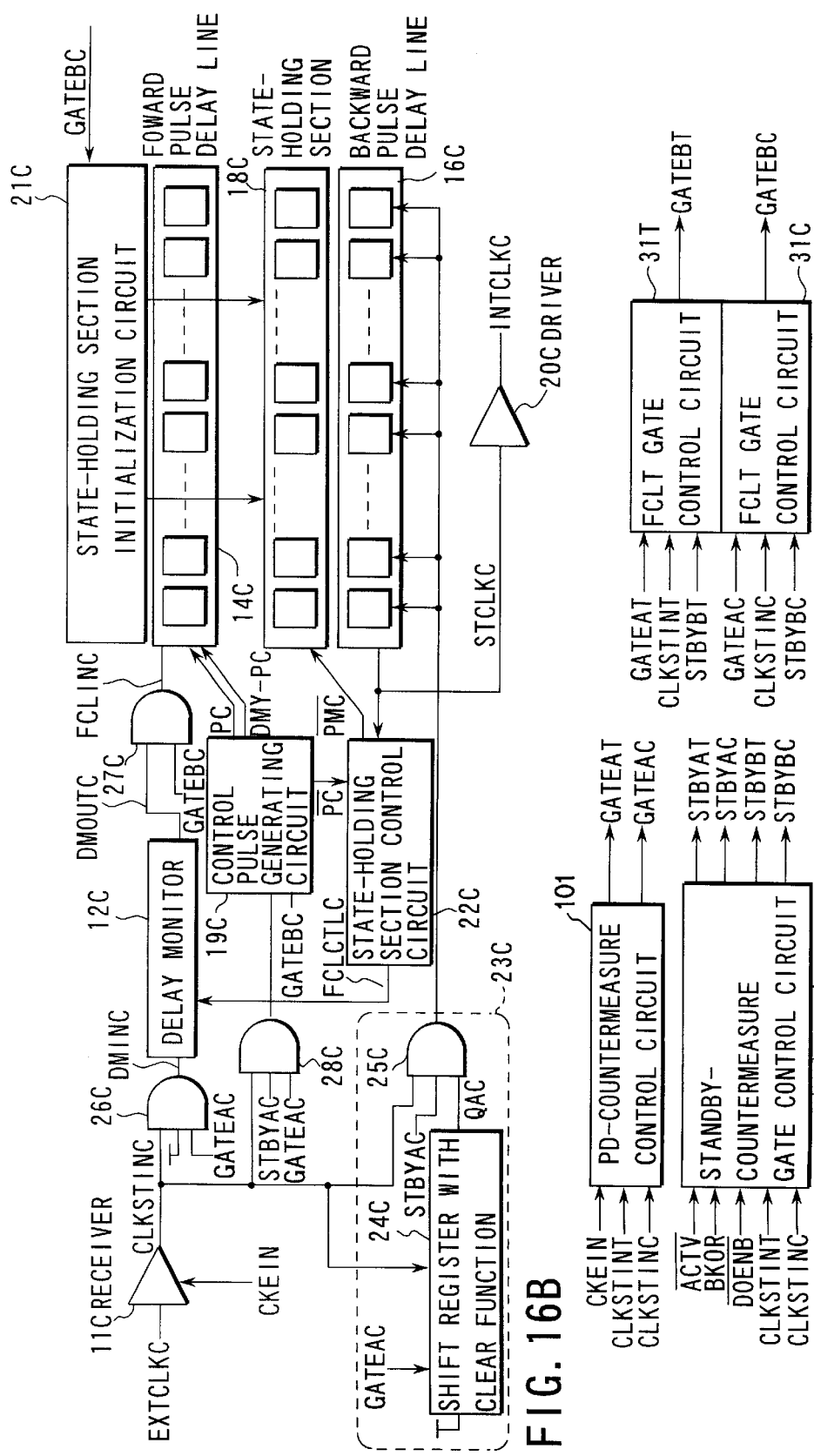
Figure 17:
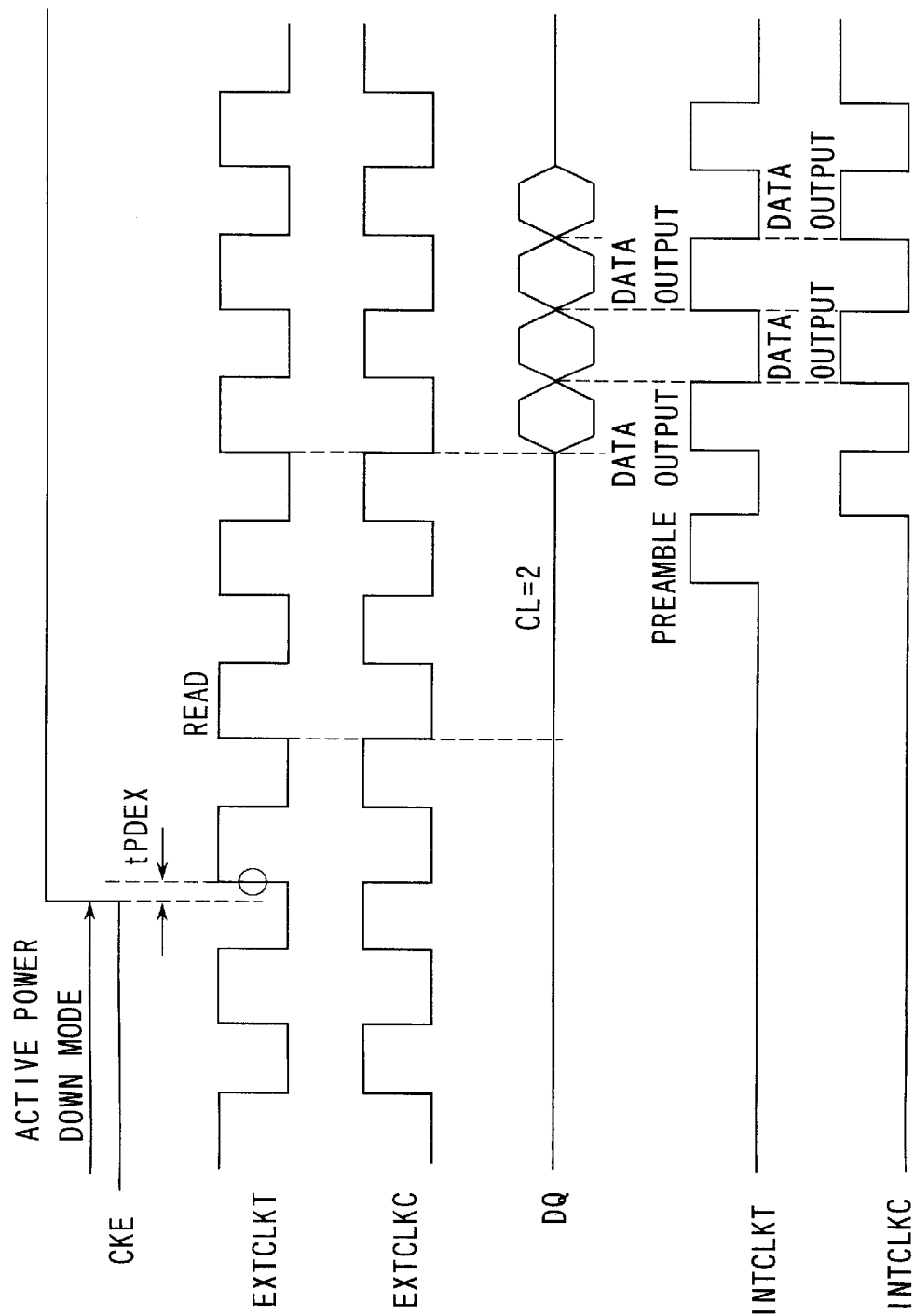
FIG. 17 is the timing chart showing the example of one operation of the double data rate synchronous DRAM.

Incidentally, although we explained about the case where the present invention was embodied on the clock synchronous circuit, which has adopted the STBD of the above-mentioned embodiment. The present invention can be easily embodied on the clock synchronous circuit of the Synchronous Adjustable Delay (SAD) system which does not provide the control pulse generating circuit 19, the state-holding section initialization circuit 21 and the state-holding section control circuit 22. In other words, in case the present invention is embodied on the clock synchronous circuit of the SAD system, there will be provided the AND circuit corresponding to the afore-mentioned AND circuit 26 between the receiver 11 and the delay monitor 12, the afore-mentioned AND circuit corresponding to the AND circuit 27 between the delay monitor 12 and the forward pulse delay line 14, and gate control circuits respectively corresponding to the afore-mentioned PD-countermeasure gate control circuit 29, standby-countermeasure gate control circuit 30, and FCLT gate control circuit. Next, we will explain the second embodiment of the present invention. FIGS. 16A through 16C are the block diagram showing the configuration of the clock synchronous circuit to be mounted on the double data rate synchronous DRAM. Incidentally, as shown in FIG. 17, the double data rate synchronous DRAM outputs READ data by synchronizing with both edges of the rise and fall of the external clock EXTCLKT. Accordingly, there is a need to generate the internal clock which synchronizes with both edges of the rise and fall of the external clock EXTCLKT, by the clock synchronous circuit. In the 128-M double data rate synchronous DRAM, two kinds of internal clock, which synchronize with both edges of the rise and fall from one kind of external clock, but two internal clocks are generated from the two external clocks which have different phases by supplying to the memory the external clock EXTCLKT and the external clock EXTCLKTC which is out of phase by half a cycle from the other clock EXTCLKT. In other words, the internal clock INTCLKT synchronizing with the rise of the external clock EXTCLKT is generated from the external clock EXTCLKT, and the internal clock INTCLKC synchronizing with the fall of the external clock EXTCLKT is generated from the external clock EXTCLKC which is out of phase from the external clock EXTCLKT, respectively. Accordingly, in the clock synchronous circuit to be mounted on the double data rate synchronous DRAM as shown in FIGS. 16A through 16C, the clock synchronous circuits shown in FIG. 6A are provided for two systems so as to generate the internal clocks INTCLKT and INTCLKC. However, as for the PD-countermeasure gate control circuit and the standby-countermeasure gate control circuit, which can share a major internal circuit for the circuits of two systems, only one circuit is provided respectively for the circuits of the two systems. In FIGS. 16A and 16B, the circuits related to the external clock EXTCLKT and the internal clock INTCLKT on one side are called the T-side circuits and are given the alphabet "T" to the respective ends of the circuits and signals on the T side of the parentheses, while the circuits related to the external clock EXTCLKC and the internal clock INTCLKC are called the C-side circuits, and are given the alphabet "C" to the respective ends of the circuits and signals on the C side, to differentiate them from each other. The PD-countermeasure gate control circuit 101 in FIG. 16C, which is provided commonly for the circuits on the T side and the C side, generates the control signals GATEAT and GATEAC by receiving the signal CKEIN (power down mode signal) which received the control signal CKE inputted from the outside for controlling the power down mode, with the receiver not illustrated, and the outputs CLKSTINT and CLKSTINC from the respective clock receivers 11 of the circuits on the T side and the C side.

Similarly, the standby-countermeasure gate control circuits 102 in FIG. 16C, which are provided commonly for the circuits on the T side and the C side, generate the control signals STBYAT and STBYAC on the T side and the control signals STBYBT and STBYBC on the C side respectively, by receiving the signal/DOENB which shows whether READ data are outputted or not, the signal BKOR which shows whether any bank is in the bank active mode or not, the signal /ACTV which determines the level at a faster timing than this signal BKOR and which shows whether the bank is in the bank active mode or not, the outputs DMOUTT and DMOUTC from the respective delay monitors 12 in the circuits on the T side and the C side, and the outputs CLKSTINT and CLKSTINC from the respective clock receivers 11 in the circuits on the T side and the C side.

Figure 18:
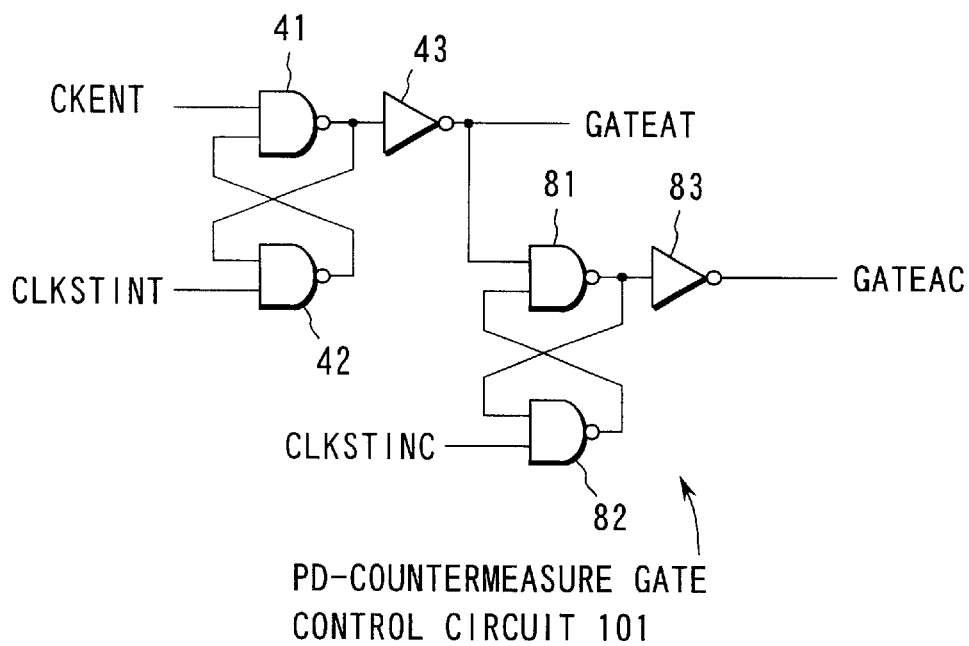
FIG. 18 is the circuit diagram showing the detailed configuration of the PD-countermeasure gate control circuit in FIG. 16C.

FIG. 18 is the circuit diagram showing the detailed configuration of the PD-countermeasure gate control circuit 101 in FIG. 16C. This circuit is provided, in the same way as the PD-countermeasure gate control circuit 29 shown in the afore-mentioned FIG. 7, with two 2-input type NAND circuits 41 and 42 as well as with one inverter 43, and further with two 2-input type NAND circuits 81 and 82 as well as with one inverter 83.

The circuit comprised of the above-mentioned NAND circuits 41 and 42 and the inverter 43, receiving the control signals CKEIN and the signal CLKSTINT, generates the T-side control signal GATEAT from these signals. The circuit comprised of the NAND circuits 81 and 82 and the inverter 83, receiving the above-mentioned control signal GATEAT and the signal CLKSTINC, generates the C-side control signal GATEAC from these signals.

Figure 19:
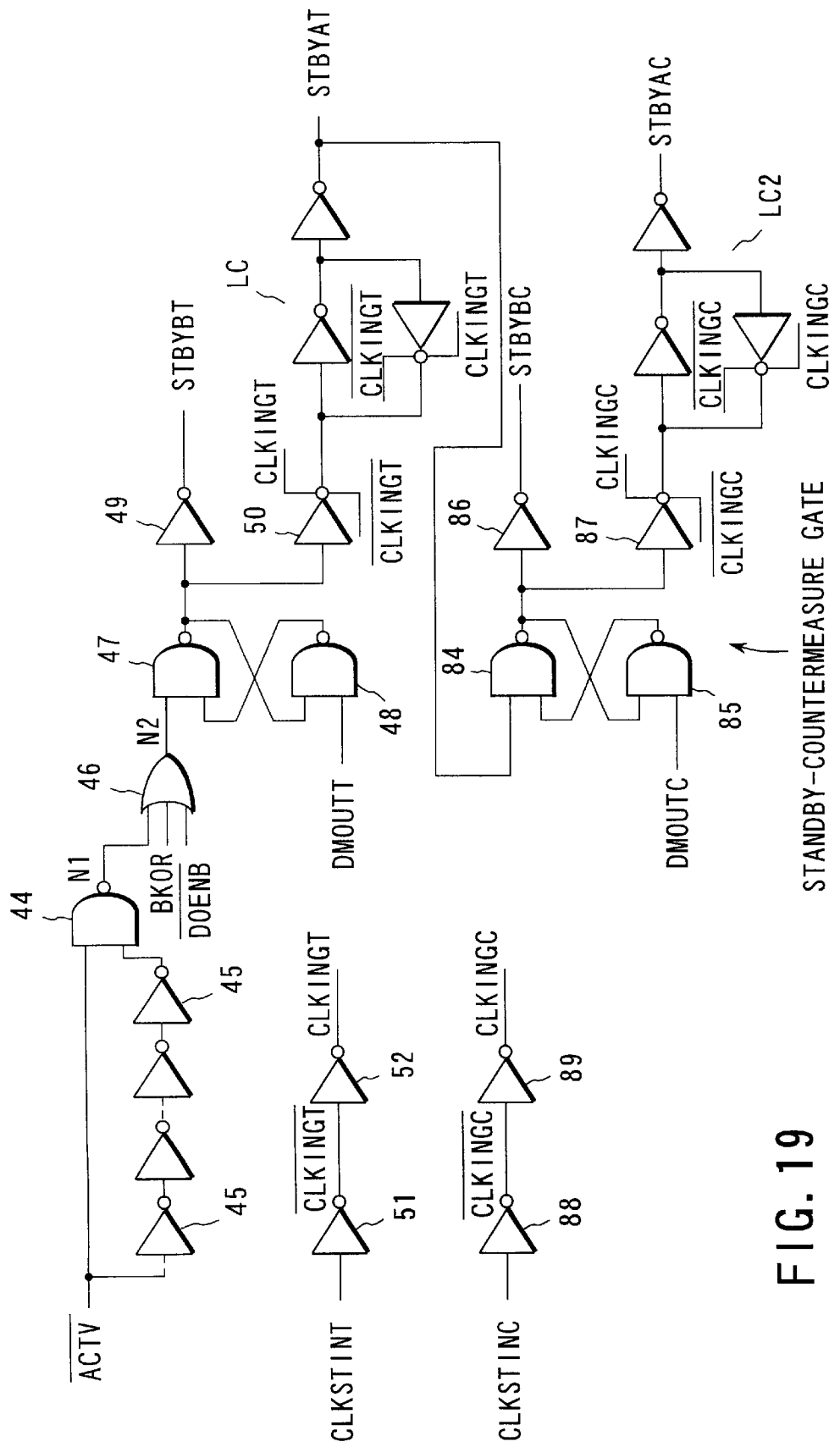
FIG. 19 is the circuit diagram showing the detailed configuration of the standby-countermeasure gate control circuit in FIG. 16C.

FIG. 19 is the circuit diagram showing the detailed configuration of the standby-countermeasure gate control circuit 102 in FIG. 16C. This circuit is provided, in the same way as the standby-countermeasure gate control circuit 30 shown in FIG. 8, with the NAND circuits 44, 47 and 48, the inverters 45, 49, 51 and 52, the OR circuit 46, the clocked inverter 50, and the latch circuit LC, and further with the NAND circuits 84 and 85, the inverter 86, 88 and 89, and the clocked inverter 87, and with the latch circuit LC2 comprised of two inverters and one clocked inverter with the configuration almost similar to the afore-mentioned latch circuit LC.

The above-mentioned NAND circuits 44, 47 and 48, the inverter 45, 49, 51 and 52, the OR circuit 46, the clocked inverter 50 and the circuit comprised of the latch circuit LC receive the signals /ACTV, BKOR, /DOEB, DMOUTT, and CLKSTINT, and generates the T-side control signals STBYAT and STBYBT. The NAND circuits 84 and 85, the inverter 86, 88 and 89, the clocked inverter 87 and the circuit comprised of the latch circuit LC2 receive the above-mentioned control signals STBYAT and the signal DMOUTC, and generates the C-side control signals STBYAC and STEYBC.

Figure 20:
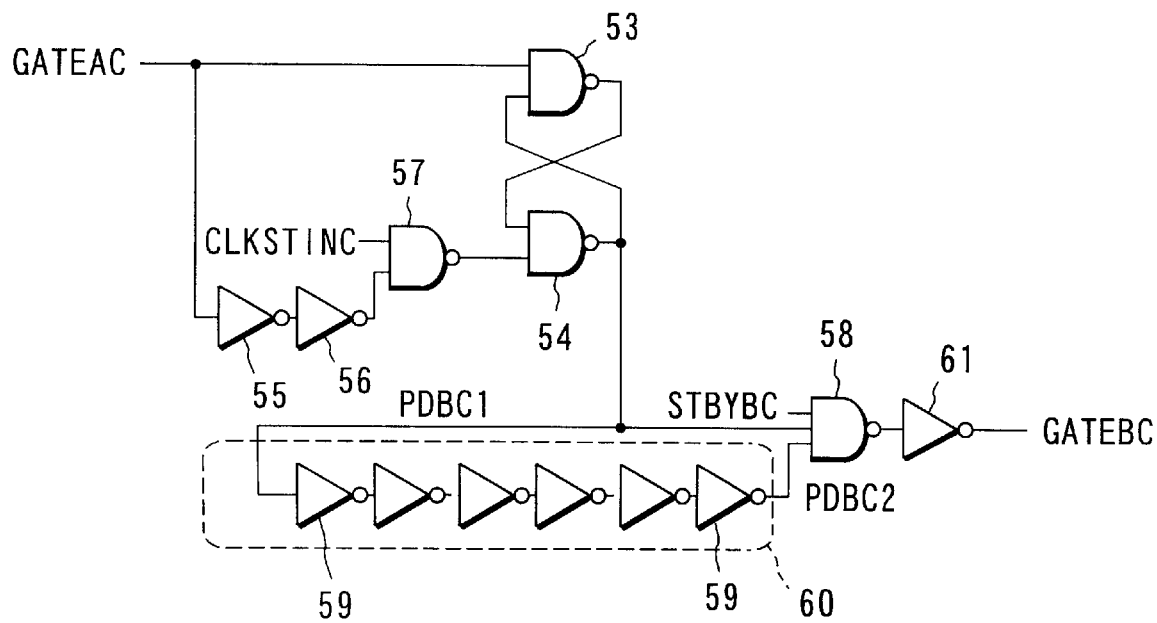
FIG. 20 is the circuit diagram showing the detailed configuration of the FCLT gate control circuit on one side in FIG. 16C.

FIG. 20 is the circuit diagram showing the detailed configuration of the C-side FCLT gate control circuit 31C in FIG. 16B. This circuit is provided, in the same way as the FCLT gate control circuit 31 shown in the above-mentioned FIG. 9, with the NAND circuits 53, 54, 57 and 58, and the inverter 55, 56, 59 and 61. However, the difference of this circuit from FIG. 9 is that this circuit inputs the control signal GAEAC in place of the control signal GATEAT, the signal CLKSTINC in place of the signal CLkSTINT, and the control signal STBYBT in place of the control signal STBYBT, and outputs the control signal GATEBC in place of the control signal GATEBT.

It should be noted that the configuration of the T-side FCLT gate control circuit 31T in FIG. 16A is the same as the FCLT gate control circuit 31 shown in FIG. 9.

In the clock synchronous circuit of such a configuration, the operation stop control method of the STBD in the circuit section, which generate the internal clock INTCLKT from the T-side external clock EXTCLKT, is the same as explained in the form of the first embodiment before. Accordingly, we will explain below the operation stop control method of the STBD in the circuit section, which generates the internal clock INTCLKC from the C-side external clock EXTCLKC.

All the commands which will serve as the operation stop and restart signals are entered by synchronizing with the "H" edge of the external clock EXTCLKT. Accordingly, as the cycle τ of the external clock EXTCLKT changes, the phase relation between these commands and the "H" edge of the external clock EXTCLKT will also change. In order to avoid dependence on the cycle, the operation stop and restart signals will be generated, in the circuit section where the internal clock INTCLKC is generated from the C-side external clock EXTCLKC, by delaying by a half cycle from the operation stop and restart signals in the circuit section where the internal clock INTCLKT is generated from the T-side external clock EXTCLKT.

Figure 21:
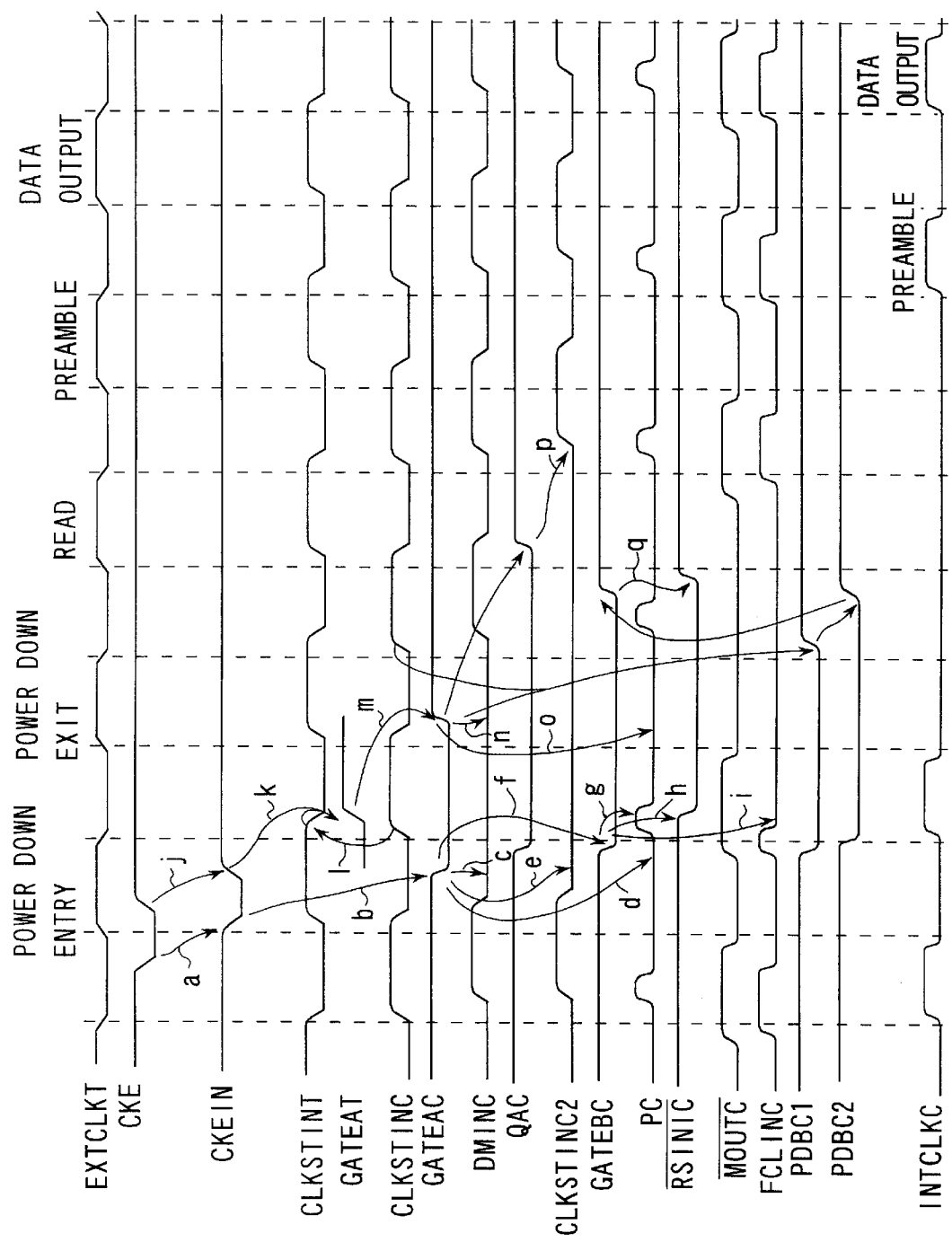
FIG. 21 is the waveform diagram showing the example of one operation of the clock synchronous circuit in FIGS. 16A through 16C.

We will explain the operation of the C-side circuit section in a case where the power down entry and the power down exit take place at a certain interval, by using the waveform diagram of FIG. 21. The PD-countermeasure gate control circuit 101, when it receives the power down entry (FIG. 21-a), turns the control signal GATEAT to "L" and then the control signal GATEAC to "L" (FIG. 21-b). This operation causes the AND circuits 26C, 28C and 25C to close respectively, turning the outputs DMINC and CLKSTINC from the AND circuits 26C and 25C to "L" and at the same time the output PT of the control pulse generating circuit 19C, which receives the output of the AND circuit 28C, to "L" (FIGS. 21-c, 21-d and 21-e).

In the meantime, receiving the control signal GATEAC, the FCLT gate control circuit 31C turns the control signal GATEBC to "L" (FIG. 21-f). Then the AND circuit 27C, receiving this control signal GATEAC, closes and turns its output CFCLINC to "L" (FIG. 21-g).

After that, the control pulse generating circuit 19C, receiving the control signal GATEBC, outputs only once the dummy control pulse DMY PT similar to the control pulse PT for stopping (resetting) the forward pulse in the forward pulse delay line 14C (FIG. 21-h), causing the forward pulse propagating through the forward pulse delay line 14C to disappear completely.

After that, the state-holding section control circuit 21C which has received the control signal GATEBC, turns the internal signal /RSINIC to "L" (FIG. 21-i) once and initializes the state-holding section 18C.

Next, let us suppose that the power down exit takes place after the lapse of a certain time. The PD-countermeasure gate control circuit 101, receiving the power down exit (FIG. 21-j), detects that the clock CLKSTINT is "L", and turns the control signal GATEAT to "H" (FIG. 21-k). When the clock CLKSTINT is "L", the clock CLKSTINC out of phase by half a cycle is "H" (FIG. 21-l). Accordingly, the control signal GATEAC, like the control signal GATEAT, by the control operation to detect that the clock CLKSTINC is "L", will automatically go out of phase by half a cycle from "H" to "H" (FIG. 21-m).

The AND circuits 26C and 28C, which receive the control signal GATEAC that has changed to "H", will both change to the mode which will let the output CLKSTINC of the receiver 11 pass (FIG. 21-n, 21-o). Also the control signal GATEAC changes to "H", and further after the clock CLKSINC at the first cycle is inputted to the shift register 24C in the input cut-off circuit 23C, the signal QAC changes to "H", causing the AND circuit 25C to open and causing the receiver 11 to output the output CLKSTINC as CLKSTINC2 (FIG. 21-p).

In the meantime, after changing to the mode of the AND circuit 26C which will let the output from the receiver 11 pass, the AND circuit 26C will detect, at the timing with the lapse of the designated time, that output DMOUTC from the delay monitor 12C is "L", and will turn the control signal GATEBC to "H". Receiving this control signal GATEBC, the state-holding section initialization circuit 21C releases the initialization of the state-holding section 18C to prepare for the set operation of the first forward pulse (FIG. 21-q).

The foregoing is the operation of the STBD for stop-control operation in the circuit section on the C side in the active power down mode.

Next, we will explain the stop-control operation in the standby mode.

Figure 22:
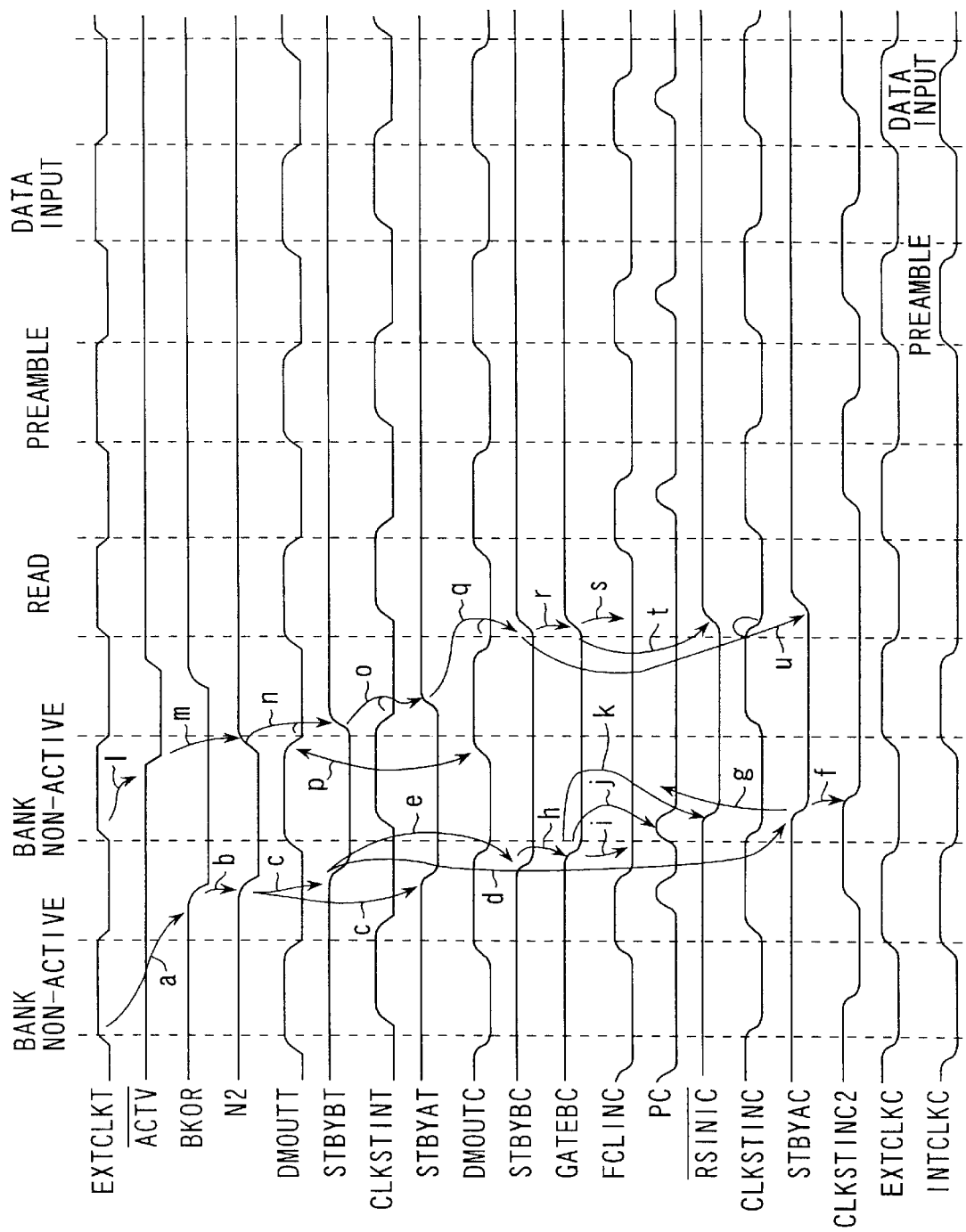
FIG. 22 is the waveform diagram showing the example of one operation of the clock synchronous circuit in FIGS. 16A through 16C.

By using the waveform diagram in FIG. 22, we will explain the operation in a case where the operation stops under the condition where there are no output of READ data from the memory with all the banks in the non-active mode, and after that a certain bank is made active to restart the operation.

When all the banks are turned to the non-active mode under the condition where there is no output of READ data from the memory (the control signal /DOENB is "L"), the signal BKOR turns to "L" (FIG. 22-a), causing the signal N2 to change to "L" (FIG. 22-b). This operation causes the output of the NAND circuit 47 composing the flip-flop in the standby-countermeasure gate control circuit 102 to change to "H" and the control signals STBYAT and STBYBT outputted from the clocked inverter 50 and the inverter 49 following it to turn to "L" (FIG. 22-*c*).

After that, receiving the control signal STBYBT of "L", the control signals STBYAC and STBYBC outputted from the standby-countermeasure gate control circuit 102 both turn to "L" (FIGS. 22-*d* and 22-*e*). When the control signal STBYAC changes to "L". The AND circuit 28C and 25C receiving this signal close, and the output PT from the control pulse generating circuit 19C receiving the output of the AND circuit 28C and the output CLKSINC2 of the AND circuit 25C turn to "L" (FIG. 22-*g*).

In the meantime, when the control signal STBYBC turns to "L", the output of the NAND circuit 58C in the FCLT gate control circuit 31C receiving this signal STBYBC turns to "H" and the control signal GATEBC outputted from the inverter following it turns to "L" (FIG. 22-*h*). Receiving this control signal GATEBC, the AND circuit 27C closes and its output turns to "L" (FIG. 22-*i*). Furthermore, after receiving the control signal GATEBC, the control pulse generating circuit 19C outputs only once the dummy control pulse DMY PC similar to the control pulse signal PT which is used for stopping the propagation of the forward pulse, (resetting the forward pulse delay line 14C) (FIG. 22-*j*). And by inputting this dummy control pulse signal DMY PC, the forward pulse delay line 14C is reset, causing the forward pulse propagating here to disappear completely.

After that, receiving the control signal GATEBC, the state-holding section initialization circuit 21C turns the internal signal /RSINIC for initialization to "L" (FIG. 22-*k*), initializing (resetting) the state-holding section 18C.

In this case, the AND circuit 26C cannot be closed like the active power down mode. Accordingly, the output CLKSTINC from the clock receiver 11C is constantly supplied to the delay monitor 12C during the standby mode.

Let us suppose that in the cycle next to the non-active cycle, a certain bank is made active. When this activation of the bank causes the signal /ACTV to change to "H" (FIG. 22-*l*), the output signal N1 of the NAND circuit 44C in the standby-countermeasure gate control circuit 30C till turn to "H" and the output signal N2 of the OR circuit 46C following it will also change to "H" (FIG. 22-*m*).

After the signal N2 has turned to "H", detect that the output DMOUTC of the delay monitor 12C is "L" so that only the clock meeting the cycle can be supplied to the forward pulse delay line 14C. This detection of the signal DMOUTC is performed in the NAND circuit 48C in the standby-countermeasure gate control circuit 30C. And when it is detected that this signal DMOUTC is "L", the control signal STBYBT outputted from the state-holding section control circuit 30T changes to "H" (FIG. 22-*n*).

Furthermore, "L" of the output CLKSTINT of the receiver 11T is detected, the control signal STBYAT outputted from the standby-countermeasure gate control circuit 30T turns to "H" (FIG. 22-*o*). When this control signal STBYAT is "H", the output DMOUTC from the delay monitor 12T is "L". On the other hand, the output DMOUTC from the delay monitor 12C, which is out of phase by half a cycle, is "H" (FIG. 22-*p*). Because of the circuit which receives the control signal STBYAT of the T-side, composed of the NAND circuits 84 and 85, the inverter 86 and the clocked inverter 87, it is detected that the signal DMOUTC is "L" as in the case of the T-side. The control signal STBYBC on the C side automatically slips out of phase by half a cycle from the control signal STBYBT to become "H" (FIG. 22-*q*).

After receiving the control signal STBYBC which has changed to "H", the control signal GATEBC outputted from the FCLT gate control circuit 31C will change to "H" (FIG. 22-*r*). Also when this control signal GATEBC becomes "H", the AND circuit 27C which will receive the control signal, will open (FIG. 22-*s*). Furthermore, receiving this control signal GATEBC, the state-holding section initialization circuit 21C will release the initialization of the state-holding section 18C to prepare for the set operation of the state-holding section 18C by the first forward pulse (FIG. 22-*t*).

In the meantime, after the control signal STBYBC has turned to "H", the control signal STBYAC will change to "H" when "L" of the output CLKSTINC from the receiver 11C is detected (FIG. 22-*u*).

The foregoing is the stop-control operation of the STBD on the C-side during the standby mode.

As stated above, either in the case of the power down mode or in the case of the standby mode, it is possible to generate the stop and restart signals of the C-side by delaying them by half a cycle from those of the T-side. Then the rest is the same as the T-side to control the operation.

As described above, it is possible by the present invention to provide the clock synchronous circuit which enables stopping the output operation of the clock and reducing power consumption when it is not needed and also which enables restarting the stable output operation of the clock when it is needed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A clock synchronous circuit for use in semiconductor devices that operates in a power down mode and a standby mode, said circuit comprising:

a clock receiver for receiving an external clock signal;

a delay monitor for receiving and delaying an output of the clock receiver;

a first delay circuit for receiving and delaying an output of the delay monitor;

a second delay circuit for receiving an output of the clock receiver in a cycle next to the signal delayed by the first delay circuit, and for delaying the output by a delay time substantially equal to a delay time of the first delay circuit;

a driver for receiving an output of the second delay circuit and outputting an internal clock signal;

a first gate circuit provided between the clock receiver and the delay monitor, for controlling supplying of the output of the clock receiver to the delay monitor, in accordance with a first control signal; and a second gate circuit provided between the delay monitor and the first delay circuit, for controlling supplying of the output of the delay monitor to the first delay circuit, in accordance with a second control signal.

2. The clock synchronous circuit according to claim 1, wherein the delay time of the delay monitor is substantially equal to a sum of the delay time of the clock receiver and the delay time of the driver.

3. The clock synchronous circuit of claim 1, further comprising a control signal generating circuit for generating the first and second control signals.

4. The clock synchronous circuit according to claim 1, wherein in the power down mode, the first gate circuit is controlled by the first control signal, not to supply the output of the clock receiver to the delay monitor, and the second gate circuit is controlled by the second control signal, not to supply the output of the delay monitor to the first delay circuit.

5. The clock synchronous circuit according to claim 1, wherein in the standby mode, the first gate circuit is controlled by the first control signal, to supply the output of the clock receiver to the delay monitor, and the second gate circuit is controlled by the second control signal, not to supply the output of the delay monitor to the first delay circuit.

6. The clock synchronous circuit according to claim 1, wherein the first gate circuit comprises a first AND circuit for receiving at least the output of the clock receiver and the first control signal, and the second gate circuit comprises a second AND circuit for receiving the output of the delay monitor and the second control signal.

7. A clock synchronous circuit for use in semiconductor devices that operates in a power down mode and a standby mode, said circuit comprising:
   a clock receiver for receiving an external clock signal;
   a first gate circuit for receiving at least an output of the clock receiver and a first control signal and controlling supplying of the output of the clock receiver in accordance with the first control signal;
   a delay monitor for receiving and delaying an output of the first gate circuit;
   a second gate circuit for receiving an output of the delay monitor and a second control signal and controlling supplying of the output of the delay monitor in accordance with a second control signal;
   a forward pulse delay circuit including a plurality of first delay units connected in cascade, designed to receive the output of the second gate circuit, each of the first delay units delay the output by a specific time, respectively, and supply the output as a forward pulse to the following first delay unit;
   a backward pulse delay circuit including a plurality of second delay units connected in cascade, designed to receive the output of the clock receiver, each of the second delay units delay the pulse for a specific time, respectively, and supply the output as a backward pulse to the following second delay unit;
   a driver for receiving the backward pulse supplied from the backward pulse delay circuit and generating an internal clock signal from the backward pulse;
   a state-holding section including a plurality of state-holding circuits associated with the first delay units and second delay units, said state-holding section being one designed to control the second delay units such that each state-holding circuit comes to hold a set state when the associated first delay unit receives a forward pulse and a reset state when the associated second delay unit receives a backward pulse and that the output of the clock receiver is input as a backward pulse to any second delay unit that is associated with a state-holding circuit which comes to hold a reset state after the output of the delay monitor is input to the forward pulse delay circuit and before the backward pulse is propagated through the back pulse delay circuit;
   a third gate circuit for receiving the output of the clock receiver, the first control signal and a third control signal and controlling the output of the clock receiver in accordance with the first control signal and the third control signal;
   a control pulse generating circuit for receiving the output of the clock receiver and the second control signal, controlling the output of the third gate circuit in accordance with the second control signal, and generating a first control pulse for resetting the first delay units;
   a state-holding circuit for receiving the first control pulse and generating the second control pulse for resetting some of the state-holding circuits provided in the state-holding section, in accordance with the first control pulse; and
   a control signal generating circuit for generating the first, second and third control signals.

8. The clock synchronous circuits of claim 7, wherein the delay time of the delay monitor is substantially equal to a sum of the delay time of the clock receiver and the delay time of the driver.

9. The clock synchronous circuit of claim 7, further comprising a state-holding initializing circuit for initializing the state-holding section, thereby setting the state-holding circuits in the reset state.

10. The clock synchronous circuits according to claim 9, wherein the state-holding initializing circuit receives the second control signal and initializes the state-holding section, thereby setting the state-holding circuits in the reset state.

11. The clock synchronous circuits according to claim 7, wherein the control signal generating circuit comprises:
   a first control signal generating circuit for receiving a power down mode signal and the output of the clock receiver and generating the first control signal;
   a second control signal generating circuit for receiving a first signal which indicates whether data is read from an internal memory having a plurality of banks which are controlled by the internal clock signal, a second signal which indicates whether any of the banks is active, the output of the clock receiver and the output of the delay monitor and generating the third control signal and a fourth control signal; and
   a third control signal generating circuit for receiving the first control signal, the fourth control signal and the output of the forward pulse delay circuit and generating the second control signal.

12. The clock synchronous circuit according to claim 7, further comprising an input cut-off circuit for stopping the supply of the output of the clock receiver to the forward pulse delay circuit during a period from the start of supplying the external clock signal.

13. The clock synchronous circuit according to claim 12, wherein the input cut-off circuit stops the supply of the output of the clock receiver to the backward pulse delay circuit, from the start of supplying the external clock signal until the clock receiver finishes outputting a clock signal corresponding to the first pulse of the external clock signal.

14. The clock synchronous circuit according to claim 13, wherein the input cut-off circuit comprises:
   a shift register for shifting a signal of first logic level and outputting the same in synchronism with the output of the clock receiver; and
   a logic circuit for generating a logic signal from the outputs of the shift register and clock receiver and outputting the same in synchronism with the third control signal.

15. The clock synchronous circuit according to claim 7, wherein the state-holding section control circuit receives the backward pulse, from the backward pulse delay circuit and lengthens the delay time of the delay monitor by a given value in accordance with the backward pulse received.

16. A clock synchronous circuit for use in a semiconductor device that operates in a power down mode and a standby mode, said circuit comprising:

a first clock receiver for receiving a first external clock signal;

a first delay monitor for receiving and delaying an output of the first clock receiver;

a first delay circuit for receiving and delaying an output of the first delay monitor;

a second delay circuit for receiving the output of the first clock receiver in a cycle next to the signal delayed by the first delay circuit, and for delaying the output by a delay time substantially equal to a delay time of the first delay circuit;

a first driver for receiving an output of the second delay circuit and generating a first internal clock signal;

a first gate circuit provided between the first clock receiver and the first delay monitor, for controlling supplying of the output of the first clock receiver to the first delay monitor in accordance with a first control signal;

a second gate circuit provided between the first delay monitor and the first delay circuit, for controlling supplying of the output of the first display monitor to the first delay circuit in accordance with a second control signal;

a second clock receiver for receiving a second external clock signal that is out of phase with respect to the external clock;

a second delay monitor for receiving and delaying the output of the second clock receiver;

a third delay circuit for receiving and delaying the output of the second delay monitor;

a fourth delay circuit for receiving the output of the second clock receiver in a cycle next to the signal delayed by the third delay circuit, and for delaying the output of the second clock receiver, by a time substantially equal to a delay time of the third delay circuit;

a second driver for receiving an output of the fourth delay circuit and outputting a second internal clock signal;

a third gate circuit provided between the second clock receiver and the second delay monitor, for controlling supplying of the output of the second clock receiver to the second delay monitor in accordance with a third control signal; and a fourth gate circuit provided between the second delay monitor and the third delay circuit, for controlling supplying of the output from the second delay monitor to the third delay circuit in accordance with a fourth control signal.

17. The clock synchronous circuit according to claim 16, wherein the first delay monitor has a delay time that is substantially equal to a sum of the delay time of the first clock receiver and the delay time of the first driver, and the second delay monitor has a delay time that is substantially equal to a sum of the delay time of the second clock receiver and the delay time in the second driver.

18. The clock synchronous circuit according to claim 16, further comprising a control signal generating circuit for generating the first, second, third and fourth control signals.

19. The clock synchronous circuit according to claim 16, wherein in the power down mode, the first gate circuit is controlled by the first control signal, not to supply the output of the first clock receiver to the first delay monitor, the second gate circuit is controlled by the second control signal, not to supply the output of the first delay monitor to the first delay circuit, and the third gate circuit is controlled by the third control signal, not to supply the output of the second clock receiver to the third delay circuit.

20. The clock synchronous circuit according to claim 16, wherein in the standby mode, the first gate circuit is controlled by the first control signal, to supply the output of the first clock receiver to the first delay monitor, the second gate circuit is controlled by the second control signal, not to supply the output of the first delay monitor to the first delay circuit, the third gate circuit is controlled by the third control signal, to supply the output of the second clock receiver to the second delay monitor, and the fourth gate circuit is controlled by the fourth control signal, not to supply the output of the second delay monitor to the third delay circuit.

21. The clock synchronous circuit according to claim 16, wherein the first gate circuit comprises a first AND circuit for receiving at least the output of the first clock receiver and the fist control signal, the second gate circuit comprises a second AND circuit for receiving the output of the first delay monitor and the second control signal, the third gate circuit comprises third AND circuit for receiving at least the output of the second clock receiver and the third control signal, and the fourth gate circuit comprises a fourth AND circuit for receiving the output of the second delay monitor and the fourth control signal.

* * * * *